United States Patent
Takenaka

(10) Patent No.: US 12,369,450 B2
(45) Date of Patent: Jul. 22, 2025

(54) LIGHT-EMITTING ELEMENT

(71) Applicant: SHARP KABUSHIKI KAISHA, Sakai (JP)

(72) Inventor: Yukio Takenaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 431 days.

(21) Appl. No.: 18/008,524

(22) PCT Filed: Jun. 10, 2020

(86) PCT No.: PCT/JP2020/022904
§ 371 (c)(1),
(2) Date: Dec. 6, 2022

(87) PCT Pub. No.: WO2021/250826
PCT Pub. Date: Dec. 16, 2021

(65) Prior Publication Data
US 2023/0217675 A1    Jul. 6, 2023

(51) Int. Cl.
*H10K 50/15* (2023.01)
*H10K 50/16* (2023.01)
*H10K 85/10* (2023.01)
*H10K 50/115* (2023.01)
*H10K 102/00* (2023.01)

(52) U.S. Cl.
CPC .............. *H10K 50/15* (2023.02); *H10K 50/16* (2023.02); *H10K 85/111* (2023.02); *H10K 50/115* (2023.02); *H10K 2102/331* (2023.02)

(58) Field of Classification Search
None
See application file for complete search history.

(56) References Cited

U.S. PATENT DOCUMENTS

2008/0135835 A1    6/2008  Seo et al.
2008/0207864 A1    8/2008  Nakagawa et al.

FOREIGN PATENT DOCUMENTS

| JP | 2006144002 A | 6/2006 |
| JP | 2008146956 A | 6/2008 |
| WO | 2005/090365 A1 | 9/2005 |

*Primary Examiner* — Anthony Ho
(74) *Attorney, Agent, or Firm* — ScienBiziP, P.C.

(57) ABSTRACT

A light-emitting element includes an anode electrode, cathode electrode, an EML, and an HTL. The HTL includes a hole transport material, and a first polymer containing a polysiloxane bond in the main chain and having a functional group including a π-conjugated electron pair in a side chain of the first polymer.

9 Claims, 11 Drawing Sheets

LIGHT-EMITTING ELEMENT

TECHNICAL FIELD

The disclosure relates to a light-emitting element including a layer having carrier transport properties.

BACKGROUND ART

It is well known that luminous efficiency is lowered in a light-emitting device when mobility of electrons and mobility of positive holes are largely different from each other (for example, see JP 2008-146956 A).

SUMMARY

Technical Problem

Thus, it is desired to improve carrier balancing.

An aspect of the disclosure has been contrived in view of the above problem, and an object of the disclosure is to provide a light-emitting element that can improve carrier balancing as compared to techniques in the related art.

Solution to Problem

In order to solve the above problem, a light-emitting element according to an aspect of the disclosure includes a first electrode, a second electrode, a light-emitting layer provided between the first electrode and the second electrode, and a first layer having carrier transport properties and provided between the first electrode and the light-emitting layer, wherein the first layer includes a first carrier transport material, and a first polymer containing a polysiloxane bond in a main chain and containing a functional group including a π-conjugated electron pair in a side chain of the first polymer.

Advantageous Effects of Disclosure

According to an aspect of the disclosure, it is possible to provide a light-emitting element that can improve carrier balancing as compared to techniques in the related art.

DESCRIPTION OF EMBODIMENTS

First Embodiment

Hereinafter, an embodiment of the disclosure will be described. In the following description, a "lower layer" means a layer that is formed in a process preceding a process in which a layer as a comparison target is formed, while an "upper layer" means a layer that is formed in a process following a process in which a layer as a comparison target is formed. In the disclosure, a description of "from A to B" for two numbers A and B is intended to mean "equal to or greater than A and equal to or less than B", unless otherwise specified.

Overall Configuration of Light-Emitting Element

A light-emitting element according to the present embodiment includes a first electrode; a second electrode; a light-emitting layer provided between the first electrode and the second electrode; and a layer (a first layer having carrier transport properties) including a first carrier transport material and a first polymer, and provided between the first electrode and the light-emitting layer. The light-emitting element according to the present embodiment further includes a layer (a second layer having carrier transport properties) including a second carrier transport material and a second polymer between the second electrode and the light-emitting layer. The first polymer is a polymer containing a polysiloxane bond in a main chain and having a functional group including a π-conjugated electron pair in a side chain of the polymer. The second polymer is a polymer containing a polysiloxane bond in a main chain and including a 1 to 10 carbon alkyl group in which no substitution is made or some hydrogen atoms are substituted in a side chain of the polymer.

Hereinafter, a case in which the first electrode is an anode electrode (anode), the second electrode is a cathode electrode (cathode), the first layer having carrier transport properties (hereinafter, referred to as "first layer") is a hole transport layer, and the second layer having carrier transport properties (hereinafter, referred to as "second layer") is an electron transport layer is exemplified and described. Hereinafter, the light-emitting layer is referred to as "EML", the hole transport layer is referred to as "HTL", and the electron transport layer is referred to as "ETL".

Figure 1:
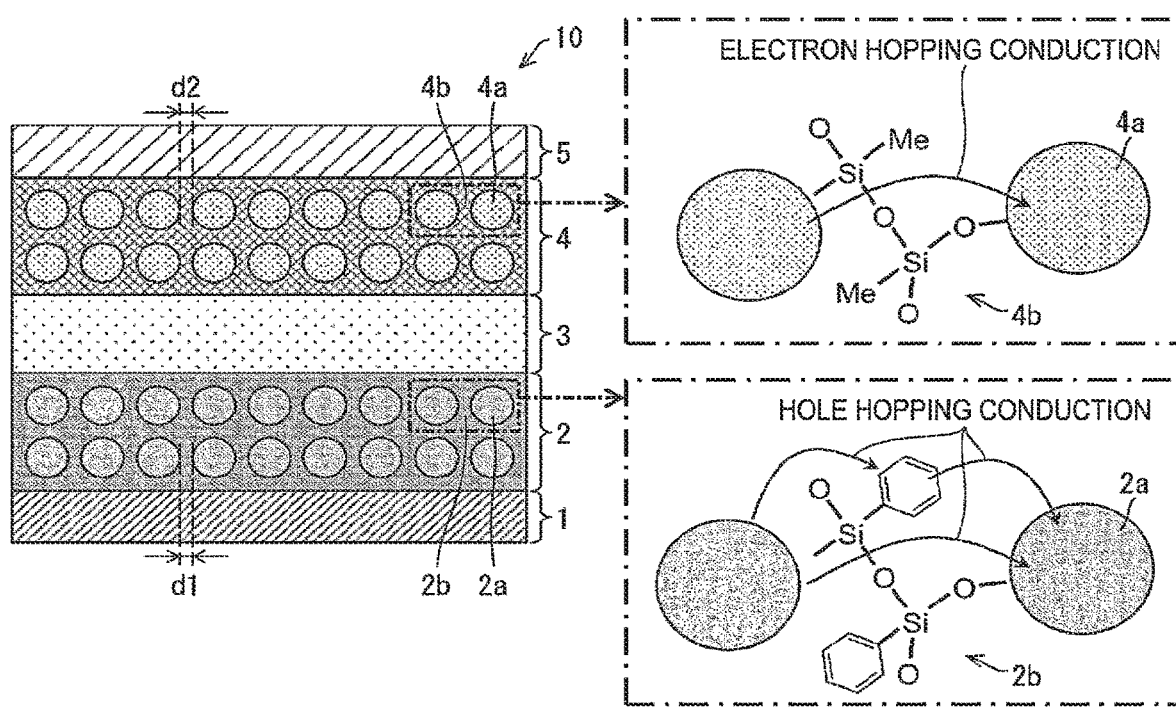
FIG. 1 is a cross-sectional view illustrating an example of an overall configuration of a light-emitting element according to a first embodiment along with diagrams, in each of which a main portion of the light-emitting element is enlarged and schematically illustrated.

FIG. 1 is a cross-sectional view illustrating an example of an overall configuration of a light-emitting element 10 according to the present embodiment along with diagrams, in each of which a main portion of the light-emitting element 10 is enlarged and schematically illustrated.

The light-emitting element 10 illustrated in FIG. 1 has a configuration in which an anode electrode 1 (first electrode), an HTL 2 (first layer), an EML 3, an ETL 4 (second layer), and a cathode electrode 5 (second electrode) are layered in that order from the lower layer side.

In the example illustrated in FIG. 1, the anode electrode 1 is a lower electrode provided on the lower layer side, and the cathode electrode 5 is an upper electrode provided on the upper layer side. Hereinafter, in the present embodiment, a direction extending from the anode electrode 1 toward the cathode electrode 5 is referred to as an upward direction. A direction opposite to the upward direction is referred to as a downward direction.

In general, the lower electrode is formed on a substrate as a support body for forming the light-emitting element. Accordingly, the light-emitting element 10 may include a substrate (not illustrated) as the support body. In this case, the substrate included in the light-emitting element 10 may be, for example, a glass substrate or a flexible substrate such as a resin substrate. When the light-emitting element 10 is, for example, part of a light-emitting device of a display device or the like, a substrate in the light-emitting device is used for the substrate mentioned above. Accordingly, the above substrate may be, for example, an array substrate where a plurality of thin film transistors are formed. In this case, the lower electrode is electrically connected to a thin film transistor of the array substrate.

The substrate may be constituted of a light-transmissive material or may be constituted of a light-reflective material. However, in a case where the light-emitting element 10 has a bottom-emitting structure or a double-sided light-emitting structure, a transparent substrate made of a light-transmissive material is used for the substrate.

The anode electrode 1 injects positive holes into the EML 3 through the HTL 2. On the other hand, the cathode electrode 5 injects electrons into the EML 3 through the ETL 4.

The anode electrode 1 and the cathode electrode 5 are each formed of a conductive material. The anode electrode 1 may have a function to serve as a hole injection layer (hereinafter referred to as an "HIL") for injecting positive holes into the HTL 2. The cathode electrode 5 may have a function to serve as an electron injection layer (hereinafter referred to as an "EIL") for injecting electrons into the ETL 4.

Of the anode electrode 1 and the cathode electrode 5, the electrode on a light extraction surface side needs to be an electrode having optical transparency. In contrast, the electrode at a side opposite to the light extraction surface may be an electrode having optical transparency or may be an electrode having light reflectivity.

Accordingly, at least one of the anode electrode 1 and the cathode electrode 5 is formed of a light-transmissive material. One of the anode electrode 1 and the cathode electrode 5 may be formed of a light-reflective material.

As the light-transmissive material, a transparent conductive film material can be used, for example. For example, indium tin oxide (ITO) or indium zinc oxide (IZO) may be used as the transparent conductive film material.

As the light-reflective material, a material with high visible light reflectivity is preferred. For example, a metal such as aluminum (Al), copper (Cu), gold (Au), silver (Ag) or the like, or an alloy or the like of the above metals may be used as the light-reflective material.

One of the anode electrode 1 and the cathode electrode 5 may be constituted as a layered body of a light-transmissive material and a light-reflective material, so as to be an electrode having light reflectivity.

The EML 3 is a layer that includes a light-emitting material and emits light by recombination of positive holes transported from the anode electrode 1 and electrons transported from the cathode electrode 5.

The EML 3 may include, for example, nano-sized quantum dots (semiconductor nanoparticles) as the light-emitting material. Known quantum dots may be used for the above-mentioned quantum dots. The quantum dot may include, for example, at least one type of semiconductor material constituted of at least one type of element selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). The quantum dots mentioned above may be a two-component core type, a three-component core type, a four-component core type, a core-shell type, or a core multi-shell type. The quantum dots may include nanoparticles doped with the at least one type of element described above, and may have a composition-gradient structure.

The HTL 2 is a layer that transports positive holes to the EML 3. The HTL 2 is provided in contact with the EML 3. The HTL 2 may have a function of inhibiting the transport of positive holes.

The HTL 2 includes a hole transport material $2a$ as a carrier transport material (first carrier transport material) and also includes a first polymer $2b$ as a binder, as illustrated in FIG. 1.

Examples of the hole transport material include an inorganic compound such as a p-type semiconductor. Examples of the p-type semiconductor material include metal oxide, a group IV semiconductor, a group II-VI compound semiconductor, a group III-V compound semiconductor, an amorphous semiconductor and the like. Examples of the metal oxide include nickel oxide (NiO), titanium oxide ($TiO_2$), molybdenum oxide ($MoO_2$, $MoO_3$), magnesium oxide (MgO), and lanthanum nickel oxide ($LaNiO_3$). Examples of the group IV semiconductor include silicon (Si), germanium (Ge) and the like. Examples of the group II-VI compound semiconductor include zinc sulfide (ZnS), zinc selenide (ZnSe) and the like. Examples of the group III-V compound semiconductor include aluminum arsenide (AlAs), gallium arsenide (GaAs), indium arsenide (InAs), aluminum nitride (AlN), gallium nitride (GaN), indium nitride (InN), gallium phosphide (GaP) and the like. Examples of the amorphous semiconductor include p-type hydrogenated amorphous silicon, p-type hydrogenated amorphous silicon carbide and the like. Among these hole transport materials, only one type may be used. Two or more types of these hole transport materials may appropriately be mixed and used, or mixed crystal of these hole transport materials may be used.

It is desirable for the above hole transport materials to be inorganic particles, and more desirable to be fine particles (nanoparticles) formed of the above-exemplified inorganic compounds because these particles are excellent in durability and in reliability, and the film formation can be carried out by a coating method and is easy to be carried out. Among them, fine particles (nanoparticles) of metal oxide or mixed crystal-based fine particles (nanoparticles) of the metal oxide are particularly desirable for the hole transport materials 2a. Hereinafter, for convenience of explanation, fine particles of metal oxide or mixed crystal-based fine particles of the metal oxide are collectively referred to simply as "metal oxide nanoparticles". As a reason why the metal oxide nanoparticles are particularly preferable, it is cited that the metal oxide nanoparticle is particularly excellent in durability, and can be chemically bonded to the first polymer 2b by the dehydration condensation of the first polymer 2b with a hydroxy group on the surface of the metal oxide nanoparticle. It is preferable for the hole transport material 2a to be a wide-gap metal oxide nanoparticle having hole transport properties. Therefore, it is desirable for the hole transport material 2a to include at least one type of metal oxide nanoparticle selected from the group consisting of nickel oxide, titanium oxide, molybdenum oxide, magnesium oxide, and lanthanum nickel oxide, for example.

As long as the nanoparticle used for the hole transport material 2a is a nanoparticle, the shape and size thereof are not particularly limited, but a nanoparticle formed in a spherical shape and having a number average particle size (diameter) being in a range from 0.5 to 20 nm is preferred. When the number average particle size is too small, the carrier transport properties degrade and the aggregation of the nanoparticles is likely to occur. Because of this, the number average particle size is desirably 0.5 nm or greater. On the other hand, when the number average particle size (diameter) of the nanoparticle is too large, the surface roughness of the obtained nanoparticle film increases, so that an electric field concentration is likely to occur. Because of this, it is desirable for the number average particle size to be 20 nm or less from the perspective of smoothness of the nanoparticle film after film formation.

In the disclosure, regardless of the types of nanoparticles, the number average particle size of the nanoparticles may be measured by dynamic light scattering in a solution, and by using a transmission electron microscope (TEM) in a thin film. In the disclosure, the average particle size of the nanoparticles indicates the diameter of the nanoparticle at 50% of the integrated value in the particle size distribution.

The first polymer 2b is a polymer containing a polysiloxane bond in which a siloxane bond (Si—O bond) produced by the bonding of a silicon atom (Si atom) and an oxygen atom (O atom) is repeated in the main chain, and having a functional group including a π-conjugated electron pair in a side chain of the polymer. Although the weight-average molecular weight of the first polymer 2b is not particularly limited, it is preferable to be in a range from 1000 to 10000 in a solution from the perspective of the solubility into a solvent, and desirable to be 10000 or greater in a state after the film formation and heating.

The first polymer 2b is an electrically conductive polymer. As described above, it is sufficient for the first polymer 2b to be a polymer containing a polysiloxane bond in the main chain and having a functional group including a π-conjugated electron pair in a side chain of the polymer. Thus, the first polymer 2b may be a polymer in which, for example, a Si atom constituting the polysiloxane bond is a T-body (T-unit) Si atom bonded to three oxygen atoms and one organic group, and the organic group may be a functional group including a π-conjugated electron pair. The first polymer 2b may be a polymer in which a Si atom constituting the polysiloxane bond is a D-body (D-unit) Si atom bonded to two oxygen atoms and two organic groups, and at least one of the two organic groups may be a functional group including a π-conjugated electron pair. When the Si atom constituting the polysiloxane bond is the D-body Si atom, in a case where one of the organic groups is a functional group including a π-conjugated electron pair, the other organic group is not particularly limited. The other organic group may be, for example, a 1 to 10 carbon alkyl group in which no substitution is made or some hydrogen atoms are substituted. Needless to say, it is more desirable that the two organic groups bonded to the Si atom be functional groups each including a π-conjugated electron pair. The first polymer 2b may be a polymer in which Si atoms constituting the polysiloxane bond include a D-body Si atom and a T-body Si atom, and which has a functional group including a π-conjugated electron pair in a side chain.

That is, the first polymer 2b may be polysiloxane that includes a T-body (T-unit: —R$^1$SiO$_3$—) Si atom having a repeating structure represented by a structural formula (1) given below, for example. The first polymer 2b may also be polysiloxane that includes a T-body Si atom, and a D-body (D-unit: —R$^2$R$^3$SiO$_2$—) Si atom having a repeating unit represented by a structural formula (2) given below. In the polysiloxane including both the T-body Si atom and the D-body Si atom as described above, the content ratio of the repeating units of the D-body represented by the following structural formula (2) is preferably 20% or less in terms of a molar ratio. When the content ratio of the repeating units of the D-body exceeds 20% in the molar ratio, there is a risk of the polysiloxane being in an oil-like state. The first polymer 2b may be, for example, a block copolymer, a random copolymer, or an alternating copolymer, having a structural unit represented by a structural formula (3) given below and a structural unit represented by a structural formula (4) given below. That is, the structural unit represented by the following structural formula (3) and the structural unit represented by the following structural formula (4) may be bonded to each other.

The ratio of T-body and D-body Si atoms contained in a solid may be quantified by solid-state $^{29}$Si-NMR measurement.

[Chem. 1]

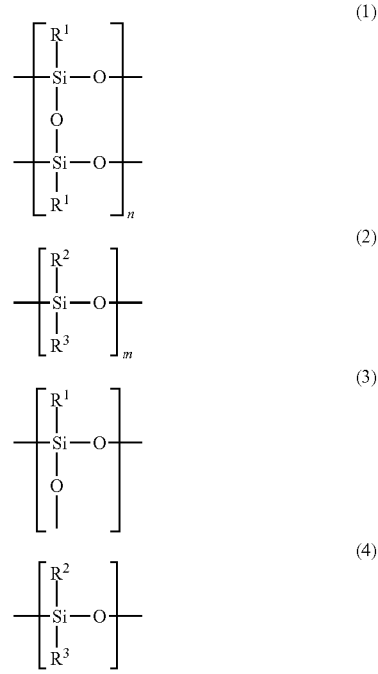

In the structural formulae (1) and (3), $R^1$ represents a functional group including a π-conjugated electron pair. In the structural formulae (2) and (4), $R^2$ represents a functional group including a π-conjugated electron pair, and $R^3$ represents a functional group including a π-conjugated electron pair or a 1 to 10 carbon alkyl group in which no substitution is made or some hydrogen atoms are substituted. In the structural formula (1), n represents an integer from 10 to 10000. In the structural formula (2), m represents an integer from 10 to 10000.

According to the present embodiment, by changing the types of functional groups represented by $R^1$, $R^2$, and $R^3$, it is possible to change a hole mobility, thereby making it possible to control the hole mobility.

Among these types of polysiloxane, polysilsesquioxane (hereinafter, referred to simply as "PSQ"), which is polysiloxane having a T-unit Si atom represented by the structural formula (1), is particularly desirable as the first polymer 2b. PSQ is excellent in durability, is very easy to be applied, and has thermosetting properties. Therefore, it is desirable for the first polymer 2b to include the above-described PSQ as a main component. PSQ is a generic term for polysiloxane including a T-body Si atom, where a Si atom constituting a siloxane bond is bonded with three oxygen atoms and one organic group is included for each of the Si atoms.

Examples of the PSQ represented by the structural formula (1) include PSQ represented by a structural formula (5) given below.

[Chem. 2]

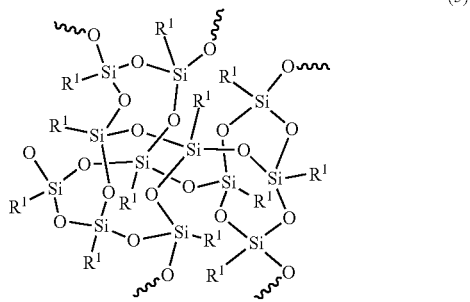

(5)

In the structural formula (5), $R^1$ is a side chain, and independently represents a functional group including a π-conjugated electron pair.

However, the PSQ represented by the structural formula (1) is not limited to the PSQ including a silsesquioxane skeleton in a random structure represented by the structural formula (5) described above. The PSQ represented by the structural formula (1) may be PSQ that includes a silsesquioxane skeleton with a soluble ladder-like structure having a regular molecule structure and a high-order structure, or PSQ including a silsesquioxane skeleton having a cage structure may be contained in a random structure.

Examples of the functional groups represented by $R^1$, $R^2$ and $R^3$, and having a π-conjugated electron pair include at least one type of functional group selected from the group consisting of an aryl group composed of any of a five-membered ring, a six-membered ring, and a seven-membered ring; a fused ring (condensed ring) of the aryl group; a derivative of the aryl group; a derivative of the fused ring of the aryl group; a heteroaryl group composed of any of a five-membered ring, six-membered ring and seven-membered ring, and including one to three heteroatoms of at least one type selected from the group consisting of nitrogen, sulfur, oxygen, and boron; a fused ring of the heteroaryl group; a derivative of the heteroaryl group; and a derivative of the fused ring of the heteroaryl group. Here, the aryl group indicates an aryl group composed of any of a five-membered ring, a six-membered ring, and a seven-membered ring. The heteroaryl group indicates a heteroaryl group composed of any of a five-membered ring, six-membered ring and seven-membered ring, and including one to three heteroatoms of at least one type selected from the group consisting of nitrogen, sulfur, oxygen, and boron. Examples of the heteroaryl group include a nitrogen-containing heteroaryl group, a sulfur-containing heteroaryl group, an oxygen-containing heteroaryl group, a boron-containing heteroaryl group and the like. It is sufficient that, in the nitrogen-containing heteroaryl group, sulfur-containing heteroaryl group, oxygen-containing heteroaryl group, and boron-containing heteroaryl group, one to three atoms in at least one of a methine (—CH═) group and a vinylene (—CH═CH—) group contained in the aryl group are substituted with nitrogen atoms, sulfur atoms, oxygen atoms, or boron atoms.

The hole transport material 2a and the first polymer 2b may be chemically bonded as described above and composited by being bonded to each other, or may be simply mixed without being chemically bonded.

For example, the first polymer 2b may be bonded to the surface of the hole transport material 2a by a siloxane bond, as indicated by an enclosed frame depicted with a chain line in FIG. 1. FIG. 1 illustrates a case where a functional group including a π-conjugated electron pair in the first polymer 2b is a phenyl group, as an example.

The first polymer 2b may be composited with a plurality of metal oxide nanoparticles in a case where the hole transport material 2a is, for example, a metal oxide nanoparticle. Specifically, one first polymer 2b may be chemically bonded to each of the plurality of metal oxide nanoparticles, for example.

Although details will be described later, the first polymer 2b produces a silanol (—SiOH) group by hydrolyzing a starting material thereof. When the hole transport material 2a is, for example, a metal oxide nanoparticle as described above, the silanol group experiences dehydration condensation with a hydroxy group on the surface of the metal oxide nanoparticle and further experiences self-condensation, whereby the metal oxide nanoparticle and the first polymer 2b are composited together. At this time, regardless of whether the Si atom constituting the polysiloxane bond is a D-body or T-body, it is possible to obtain a composite of the hole transport material 2a and the first polymer 2b. However, when the first polymer 2b is PSQ, it is possible to form a coating film for covering the hole transport material 2a as the first polymer 2b. Accordingly, when the first polymer 2b is PSQ, it is possible to obtain a composite in which the metal oxide nanoparticle is covered with the first polymer 2b, for example, as the above-mentioned composite.

As described above, since the first polymer 2b covers the hole transport material 2a, the frequency of hopping conduction of the carrier (in this case, the positive hole) may be increased.

A hydroxy group is generally present on the surface of the metal oxide nanoparticle. In the case where the EML 3 includes a quantum dot as a light-emitting material as described above, when the metal oxide nanoparticle makes contact with the quantum dot, the luminous efficiency of the light-emitting element 10 decreases. This is because when a quantum dot is exposed to an electric field where a dipole moment contained in the hydroxy group is generated, the exciton of the quantum dot may be separated into an electron and a positive hole. In this manner, the dipole moment contained in the hydroxy group may separate the exciton of the quantum dot into an electron and a positive hole to bring about extinction (exciton extinction).

However, as described above, because the metal oxide nanoparticle and the first polymer 2b are chemically bonded, and the metal oxide nanoparticle is covered with the first polymer 2b, it is possible to almost completely eliminate the hydroxy group on the surface of the metal oxide nanoparticle. Thus, since the HTL 2 adjacent to the EML 3 includes the metal oxide nanoparticles as described above, even when the distance between the quantum dot and the metal oxide nanoparticle is short, the exciton extinction does not occur, thereby making it possible to increase the luminous efficiency. Accordingly, in this case, even when the HTL 2 adjacent to the EML 3 contains nanoparticles of the metal oxide, it is possible to improve the luminous efficiency, durability, and carrier balancing as compared to techniques in the related art without causing a rise in drive voltage.

As described above, PSQ is a thermosetting resin. By using the thermosetting resin as the first polymer 2b in this manner, it is possible to suppress or prevent a situation of being dissolved by a solvent in an application process of the EML 3, for example.

As described above, the HTL 2 is formed of a mixed film including the hole transport material 2a and the first polymer 2b. It is desirable that the HTL 2 be formed of a deposited layer of the hole transport material 2a and the first polymer 2b, and it is more desirable that the HTL 2 be formed of a deposited layer of a composite of the hole transport material 2a and the first polymer 2b. However, the HTL 2 is not limited thereto, and may include other materials aside from the hole transport material 2a and the first polymer 2b.

The above-mentioned other materials are not limited to any specific ones, and examples thereof include a polymer having hole transport properties, such as polyvinylcarbazole (PVK), poly[(9,9-dioctylfluorenyl-2,7-diyl)-co-(4,4'-(N-4-sec-butylphenyl)) diphenylamine] (TFB) and the like.

The mixing proportion of the hole transport materials 2a and the first polymer 2b (hole transport materials 2a:first polymer 2b) in the HTL 2 is preferably in a range from 15:85 to 90:10, and more preferably in a range from 30:70 to 80:30 in terms of a volume ratio for the same reason as that for the mixing proportion of electron transport materials 4a and a second polymer 4b in the ETL 4 described below. The above-mentioned reason will be described below with reference to the drawings.

In the case where the HTL 2 includes the other materials described above, the content of the other materials in the HTL 2 is preferably 20% or less, and more preferably 10% or less in the volume ratio, in order not to obstruct the condensation of the polymer.

The ETL 4 is a layer that transports electrons to the EML 3. The ETL 4 is provided in contact with the EML 3. The ETL 4 may have a function of inhibiting the transport of positive holes.

The ETL 4 includes the electron transport material 4a as a carrier transport material (second carrier transport material) and also includes the second polymer 4b as a binder.

Examples of the electron transport material include an inorganic compound such as an n-type semiconductor. Examples of the n-type semiconductor include metal oxide, a group II-VI compound semiconductor, a group III-V compound semiconductor, a group IV-IV compound semiconductor, an amorphous semiconductor and the like. Examples of the metal oxide include zinc oxide (ZnO), titanium oxide (TiO$_2$), indium oxide (In$_2$O$_3$), tin oxide (SnO, SnO$_2$), cerium oxide (CeO$_2$) and the like. Examples of the group II-VI compound semiconductor include zinc sulfide (ZnS), zinc selenide (ZnSe) and the like. Examples of the group III-V compound semiconductor include aluminum arsenide (AlAs), gallium arsenide (GaAs), indium arsenide (InAs), aluminum nitride (AlN), gallium nitride (GaN), indium nitride (InN), gallium phosphide (GaP) and the like. Examples of the group IV-IV compound semiconductor include silicon germanium (SiGe), silicon carbide (SiC) and the like. Examples of the amorphous semiconductor include hydrogenated amorphous silicon and the like. Only one type of material among these electron transport materials may be used, two or more types may be mixed and used as appropriate, or a mixed crystal-based material of these electron transport materials may be used.

It is desirable for the above electron transport materials 4a to be inorganic particles, and more desirable to be fine particles (nanoparticles) formed of the above-exemplified inorganic compounds because these particles are excellent in durability and in reliability, and the film formation can be carried out by a coating method and is easy to be carried out. Among them, it is particularly desirable for the electron transport materials 4a, similar to the hole transport materials 2a, to be metal oxide nanoparticles (in other words, fine particles of metal oxide or mixed crystal-based fine particles of the metal oxide). As a reason for this, it is cited that the metal oxide nanoparticle is particularly excellent in durability, and can be chemically bonded to the second polymer 4b by the dehydration condensation of the second polymer 4b with a hydroxy group on the surface of the metal oxide nanoparticle. It is preferable for the electron transport material 4a to be a wide-gap metal oxide nanoparticle having electron transport properties. Therefore, it is desirable for the electron transport material 4a to include at least one type of metal oxide nanoparticle selected from the group consisting of zinc oxide, titanium oxide, indium oxide, tin oxide, and cerium oxide, for example.

As long as the nanoparticle used for the electron transport material 4a is a nanoparticle, as in the hole transport material 2a, the shape and size thereof are not particularly limited, but a nanoparticle formed in a spherical shape and having a number average particle size (diameter) being in a range from 0.5 nm to 20 nm is preferred. When the number average particle size is too small, the carrier transport properties degrade and the aggregation of the nanoparticles is likely to occur. Because of this, the number average particle size is desirably 0.5 nm or greater. On the other hand, when the number average particle size (diameter) of the nanoparticle is too large, the surface roughness of the film-formed nanoparticle film increases, so that the electric field concentration is likely to occur. Because of this, it is desirable for the number average particle size to be 20 nm or less from the perspective of smoothness of the nanoparticle film after film formation. The definition of the average particle size of the nanoparticle and a measurement method thereof are as described above.

The second polymer 4b is a polymer containing a polysiloxane bond in which a siloxane bond (Si—O bond) formed by the bonding of a silicon atom (Si atom) and an oxygen atom (O atom) is repeated in the main chain, and including a 1 to 10 carbon alkyl group in which no substitution is made or some hydrogen atoms are substituted in a side chain of the polymer. Although the weight-average molecular weight of the second polymer 4b is not particularly limited, it is preferable to be in a range from 1000 to 10000 in a solution from the perspective of the solubility into a solvent, and desirable to be 10000 or greater in a state after the film formation and heating.

The second polymer 4b is an insulating polymer or a conductive polymer having a lower carrier mobility than the first polymer 2b. It is sufficient for the second polymer 4b to be a polymer containing a polysiloxane bond in the main chain and including a 1 to 10 carbon alkyl group in which no substitution is made or some hydrogen atoms are substituted in the side chain of the polymer as discussed above. Accordingly, the second polymer 4b may be, for example, a polymer where a Si atom constituting the polysiloxane bond is a T-body (T-unit) Si atom, and an organic group bonded to the Si atom is a 1 to 10 carbon alkyl group in which no substitution is made or some hydrogen atoms are substituted. The second polymer 4b may be a polymer where the Si atom constituting the polysiloxane bond is a D-body (D-unit) Si atom, and two organic groups bonded to the Si atom are each a 1 to 10 carbon alkyl group in which no substitution is made or some hydrogen atoms are substituted. The second polymer 4b may be a polymer where Si atoms constituting the polysiloxane bond include a D-body Si atom and a T-body Si atom, and a 1 to 10 carbon alkyl group in which no substitution is made or some hydrogen atoms are substituted is included in a side chain.

That is, the second polymer 4b may be polysiloxane that includes a T-body (T-unit: —$R^4SiO_3$—) Si atom having a repeating structure represented by a structural formula (6) given below, for example. The second polymer 4b may also be polysiloxane that includes a T-body Si atom, and a D-body (D-unit: —$R^5R^6SiO_2$—) Si atom having a repeating unit represented by a structural formula (7) given below. In the polysiloxane including both the T-body Si atom and the D-body Si atom as described above, the content ratio of the repeating units of the D-body represented by the following structural formula (7) is preferably 20% or less in terms of a molar ratio. When the content ratio of the repeating units of the D-body exceeds 20% in the molar ratio, there is a risk of the polysiloxane being in an oil-like state. The second polymer 4b may be, for example, a block copolymer, a random copolymer, or an alternating copolymer, having a structural unit represented by a structural formula (8) given below and a structural unit represented by a structural formula (9) given below. That is, the structural unit represented by the following structural formula (8) and the structural unit represented by the following structural formula (9) may be bonded to each other.

[Chem. 3]

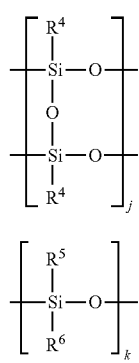

(6)

(7)

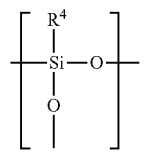

(8)

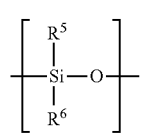

(9)

In the structural formulae (6) and (8), $R^4$ represents a 1 to 10 carbon alkyl group in which no substitution is made or some hydrogen atoms are substituted. In the structural formulae (7) and (9), $R_5$ and $R_6$ each independently represent a 1 to 10 carbon alkyl group in which no substitution is made or some hydrogen atoms are substituted. In the structural formula (6), j represents an integer from 10 to 10000. In the structural formula (7), k represents an integer from 10 to 10000.

$R^4$, $R^5$, and $R^6$ described above are each more desirably a 1 to 5 carbon alkyl group in which no substitution is made or some hydrogen atoms are substituted, and further desirably an unsubstituted 1 to 5 carbon alkyl group. As the number of carbon atoms of $R^4$, $R^5$, and $R^6$ is larger, a distance d2 between adjacent electron transport materials 4a in the ETL 4 is longer accordingly. As a result, the carrier transport properties of the electron transport materials 4a are diminished together. Therefore, the above-mentioned $R^4$, $R^5$, and $R^6$ are desired to be functional groups each having a small number of carbon atoms as much as possible.

According to the present embodiment, by changing the types of functional groups represented by $R^4$, $R^5$, and $R^6$, it is possible to change an electron mobility, thereby making it possible to control the electron mobility.

Among these types of polysiloxane, PSQ that is polysiloxane having a T-unit Si atom represented by the structural formula (6) is particularly desirable as the second polymer 4b. PSQ is excellent in durability, is very easy to be applied, and has thermosetting properties. Therefore, it is desirable for the second polymer 4b to include the above-described PSQ as a main component.

Examples of the PSQ represented by the structural formula (6) include PSQ represented by a structural formula (10) given below.

[Chem. 4]

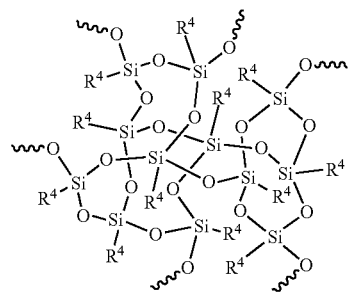

(10)

In the structural formula (10), $R^4$ is a side chain and independently represents a 1 to 10 carbon alkyl group in which no substitution is made or some hydrogen atoms are substituted.

However, the PSQ represented by the structural formula (6) is not limited to the PSQ including a silsesquioxane skeleton in a random structure represented by the structural formula (10) described above. The PSQ represented by the structural formula (6) may be PSQ that includes a silsesquioxane skeleton with a soluble ladder-like structure having a regular molecule structure and a high-order structure, or PSQ including a silsesquioxane skeleton having a cage structure may be contained in a random structure.

In $R^4$, $R^5$, and $R^6$, examples of substituents that may be included in an alkyl group (in other words, substituents with which some hydrogen atoms may be substituted) include an amino ($-NH_2$) group, a mercapto ($-SH$) group, vinyl ($CH_2=CH-$) group, a fluoro ($-F$) group and the like.

The electron transport material 4a and the second polymer 4b may be chemically bonded as described above and composited by being bonded to each other, or may be simply mixed without being chemically bonded.

For example, the second polymer 4b may be bonded to the surface of the electron transport material 4a by a siloxane bond, as indicated by an enclosed frame depicted with a chain line in FIG. 1. FIG. 1 illustrates a case where a side chain (a 1 to 10 carbon alkyl group in which no substitution is made or some hydrogen atoms are substituted) in the second polymer 4b is a methyl group, as an example.

The second polymer 4b may be composited with a plurality of metal oxide nanoparticles in a case where the electron transport material 4a is, for example, a metal oxide nanoparticle. Specifically, one second polymer 4b may be chemically bonded to each of the plurality of metal oxide nanoparticles, for example.

The second polymer 4b, as in the first polymer 2b, produces a silanol ($-SiOH$) group by hydrolyzing a starting material thereof. When the electron transport material 4a is, for example, a metal oxide nanoparticle as described above, the silanol group experiences dehydration condensation with a hydroxy group on the surface of the metal oxide nanoparticle and further experiences self-condensation, whereby the metal oxide nanoparticle and the second polymer 4b are composited. At this time, regardless of whether the Si atom constituting the polysiloxane bond is a D-body or T-body, it is possible to obtain a composite of the electron transport material 4a and the second polymer 4b. However, when the second polymer 4b is PSQ, it is possible to form a coating film for covering the electron transport material 4a as the second polymer 4b. Accordingly, when the second polymer 4b is PSQ, it is possible to obtain a composite in which the metal oxide nanoparticle is covered with the second polymer 4b, for example, as the above-mentioned composite.

In this manner, in the case where the electron transport material 4a is a metal oxide nanoparticle, because the metal oxide nanoparticle and the second polymer 4b are chemically bonded, and the metal oxide nanoparticle is covered with the second polymer 4b, it is possible to almost completely eliminate the hydroxy group on the surface of the metal oxide nanoparticle. Due to this, since the ETL 4 adjacent to the EML 3 as described above includes the metal oxide nanoparticles, even when the distance between the quantum dot and the metal oxide nanoparticle is short, the exciton extinction does not occur, and thus the luminous efficiency may be increased. Accordingly, in this case, even when the ETL 4 adjacent to the EML 3 contains the metal oxide nanoparticles, it is possible to improve the luminous efficiency, durability, and carrier balancing as compared to techniques in the related art without causing a rise in drive voltage.

As described above, the ETL 4 is formed of a mixed film including the electron transport material 4a and the second polymer 4b. It is desirable that the ETL 4 be formed of a deposited layer of the electron transport material 4a and the second polymer 4b, and it is more desirable that the ETL 4 be formed of a deposited layer of a composite of the electron transport material 4a and the second polymer 4b. However, the ETL 4 is not limited thereto, and may include other materials aside from the electron transport material 4a and the second polymer 4b.

The other materials mentioned above are not limited to any specific ones, and examples thereof include insulating polymers such as a polymethacrylic acid (PMMA), polyethyleneimine (PEI), polyethyleneimine ethoxide (PEIE) and the like; and an electron transport polymer such as [6,6]-phenyl-C61-butyric acid methyl ester (PCBM).

The content of the electron transport materials 4a, for example, the volume ratio of the electron transport materials 4a to the volume of the above-described mixed film (specifically, the volume ratio of the electron transport materials 4a to the total volume of the electron transport materials 4a and the second polymer 4b) in the ETL 4 will be described later. The content of the second polymer 4b, and the like in the ETL 4 will also be described later.

A thickness of each layer in the light-emitting element 10 may be set in the same manner as in the related art, and is not particularly limited. For example, the thickness of the carrier transport layer (HTL 2, ETL 4) is set to fall within a range from 2 nm to 500 nm. When the thickness of each layer is thin, a short circuit due to a pinhole is likely to occur, and when the layer thickness thereof is thick, the drive voltage rises. Because of this, the thickness of each layer is desirably in a range from 2 nm to 500 nm, and is more desirably in a range from 20 nm to 50 nm.

Method for Manufacturing Light-Emitting Element 10

Next, an example of a method for manufacturing the light-emitting element 10 will be described below with reference to FIG. 1.

As illustrated in FIG. 1, in a manufacturing process of the light-emitting element 10 according to the present embodiment, first, the anode electrode 1 is formed on a substrate (not illustrated) (step S1: a first electrode forming step). Sputtering, vacuum vapor deposition, chemical vapor deposition (CVD), plasma CVD, a printing method or the like, for example, may be used in the formation of the anode electrode 1, and various known techniques in the related art may be used as a method for forming the cathode electrode.

Subsequently, the HTL 2 is formed (layered) on the anode electrode 1 (step S2: a first layer forming step). For the formation of the HTL 2, for example, a coating method such as a sol-gel method, sputtering, CVD, spin coating, dip coating or the like is used.

For example, a location on the anode electrode 1, where the HTL 2 is to be formed, is coated with a mixed liquid containing the hole transport material 2a and the first polymer 2b or silanol (monomer, oligomer, or the like) as a precursor thereof, and then the mixed liquid is dried so as to form (layer) the HTL 2.

As the mixed liquid mentioned above, such a mixed liquid may be used that is obtained by subjecting, to a sol-gel reaction, the hole transport material 2a and a compound containing at least one of a monomer as a raw material of the first polymer 2b and a molecule obtained by condensing the monomer. Examples of the monomer serving as the raw material of the first polymer 2b include a trialkoxysilane, dialkoxysilane and the like. With this, the HTL 2 including a composite of the hole transport material 2a and the first polymer 2b may be formed.

However, the precursor mainly composed of a dialkoxysilane without having a reactive functional group does not solidify even when polymerized to become a polymer, and an ultimately obtained film (specifically, a mixed film including a metal oxide nanoparticle used as the hole transport material 2a and a polymer made of the above-mentioned precursor as the first polymer 2b) is not solidified. A dialkoxysilane having a reactive functional group, such as an acrylic group, an epoxy group or the like, may be solidified by mixing a radical polymerization initiator together with a polymer; however, the radical polymerization initiator is not preferred because of raising a problem of deterioration in the durability when it remains in the device. Therefore, when a precursor includes a dialkoxysilane, it is preferable to include the dialkoxysilane in such a manner that the dialkoxysilane without a reactive functional group is 20% or less in a molar ratio with respect to a trialkoxysilane.

In the sol-gel reaction, hydrolysis is performed in the solution, and then the solution is transformed to sol by performing dehydration condensation. Thereafter, the sol is transformed to gel by further progressing the reaction. The reaction in this case will be specifically described later with reference to examples.

Subsequently, the EML 3 is formed (layered) on the HTL 2, in contact with the HTL 2 (step S3: a light-emitting layer forming step). For the formation of the EML 3, various known techniques in the related art may be used as a method for forming the EML. Examples of the method for forming the EML include a vapor deposition method, printing method, ink-jet method, spin coating method, casting method, dipping method, bar coating method, blade coating method, roll coating method, gravure coating method, flexographic printing method, spray coating method, photolithography method, self-organization method (an alternating adsorption method, a self-organized monomolecular film method) and the like.

Then, the ETL 4 is formed (layered) on the EML 3 (step S4: a second layer forming step). For the formation of the ETL 4, as in the formation of the HTL 2, a coating method such as a sol-gel method, sputtering, CVD, spin coating, dip coating or the like is used, for example.

In this case, a location on the EML 3, where the ETL 4 is to be formed, is coated with a mixed liquid containing the electron transport material 4a and the second polymer 4b or silanol (monomer, oligomer, or the like) as a precursor thereof, and then the mixed liquid is dried so as to form (layer) the ETL 4.

As the mixed liquid mentioned above, such a mixed liquid may be used that is obtained by subjecting, to a sol-gel reaction, the electron transport material 4a and a compound containing at least one of a monomer as a raw material of the second polymer 4b and a molecule obtained by condensing the monomer. Examples of the monomer serving as the raw material of the second polymer 4b include a trialkoxysilane, dialkoxysilane and the like. With this, the ETL 4 including a composite of the electron transport material 4a and the second polymer 4b may be formed. In this case as well, as in step S2, in the sol-gel reaction, hydrolysis is performed in the solution, and then the solution is transformed to sol by performing dehydration condensation. Thereafter, the sol is transformed to gel by further progressing the reaction.

Subsequently, the cathode electrode 5 is formed (layered) (step S5: a second electrode forming step). For the formation of the cathode electrode 5, various known methods in the related art as the methods for forming the anode electrode may be used. Specifically, the same method as the method for forming the anode electrode 1 may be used for forming the cathode electrode 5. By the method discussed above, the light-emitting element 10 may be manufactured.

Formation of HTL 2 and ETL 4 by Using Sol-Gel Method

In the following, a case in which a monomer serving as a raw material of the first polymer 2b and a monomer serving as a raw material of the second polymer 4b are trialkoxysilanes is exemplified, and a method for forming the HTL 2 and the ETL 4 by hydrolysis and dehydration condensation of the raw materials is described.

Figure 2:
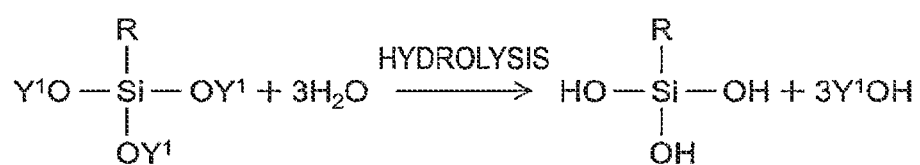
FIG. 2 is a diagram illustrating a reaction scheme presenting hydrolysis of a trialkoxysilane.

FIG. 2 is a diagram illustrating a reaction scheme presenting hydrolysis of a trialkoxysilane. In FIG. 2, R represents the above-described $R^1$ or $R^4$. $Y^1$ independently represents a 1 to 4 carbon alkyl group.

Examples of the trialkoxysilane include a phenyltrimethoxysilane, phenyltriethoxysilane, 3-amninopropyltriethoxysilane, 3-carbazolylpropyltriethoxysilane, 3-mercaptopropyltriethoxysilane, 3,3,3-trifluoropropyltriethoxysilane, 3-carbazolylpropylethoxysilane, N-(3-trimethoxysilylpropyl) pyrrole and the like.

As illustrated in FIG. 2, when the trialkoxysilane is hydrolyzed under an acid or a base catalyst, a silane is obtained in which an alkoxy ($—OY^1$) group has partially or fully changed to a hydroxy group (to a silanol group). When a trialkoxy group is changed to the hydroxy group, dehydration condensation is likely to occur. The above-discussed $R^1$ and $R^4$ are not hydrolyzed.

Although not illustrated, when a dialkoxysilane is hydrolyzed under an acid or a base catalyst, a silane is also obtained in which an alkoxy ($—OY^1$) group has partially or fully changed to a hydroxy group. When a dialkoxy group is changed to the hydroxy group, dehydration condensation is also likely to occur. The aforementioned $R^2$, $R^3$, $R^5$, and $R^6$ are not hydrolyzed.

Figure 3:
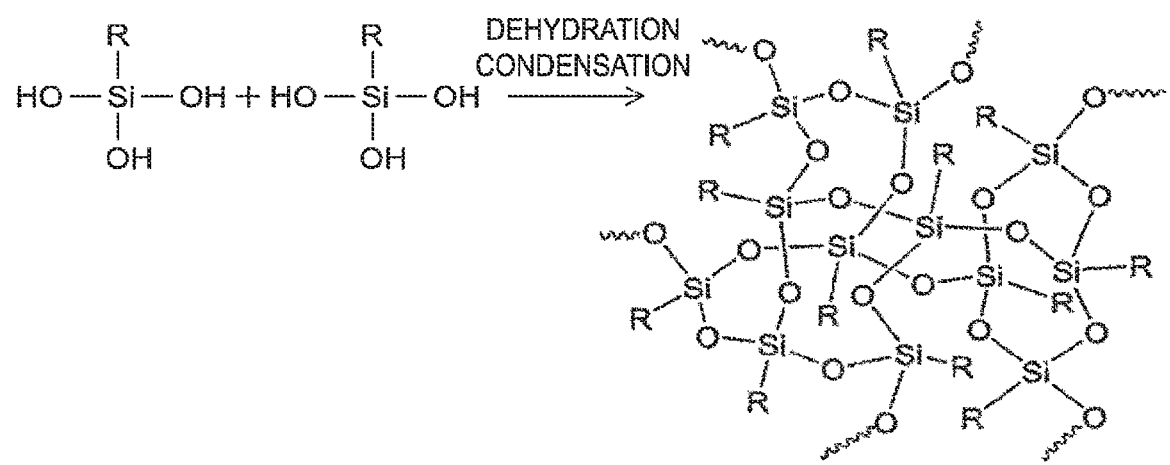
FIG. 3 is a diagram illustrating a reaction scheme presenting dehydration condensation of trisilanol.

FIG. 3 is a diagram illustrating a reaction scheme presenting dehydration condensation of trisilanol in which a trialkoxy group of a trialkoxysilane is fully changed to a hydroxy group, as an example of a silane having a hydroxy group.

After the trialkoxysilane illustrated in FIG. 2 is hydrolyzed, dehydration condensation is subsequently carried out, and thus the PSQ represented by, for example, the structural formula (5) or structural formula (10) is obtained, as illustrated in FIG. 3.

Figure 4:
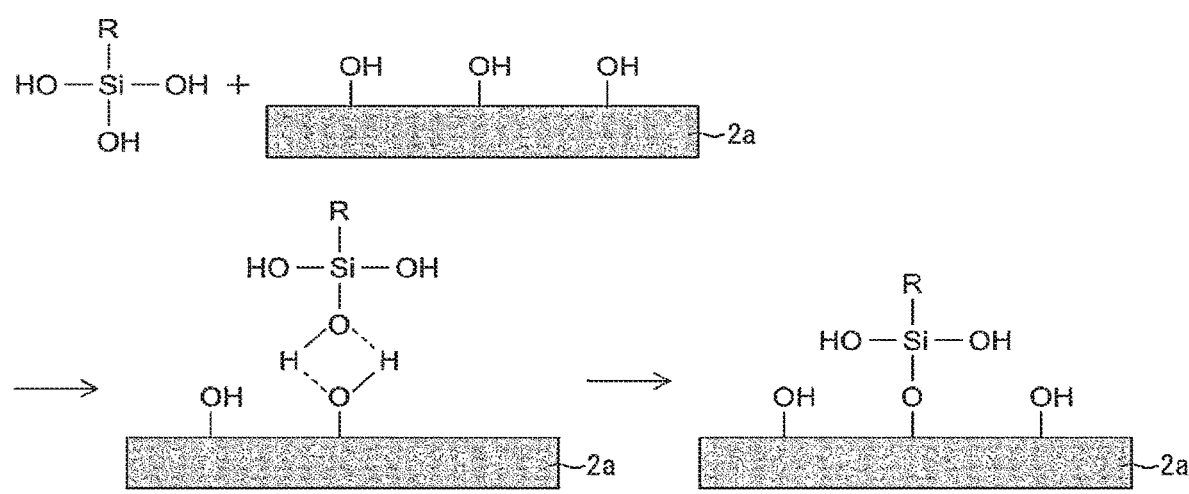
FIG. 4 is a diagram schematically illustrating a reaction scheme in which trisilanol reacts with a hydroxy group on a surface of a metal oxide nanoparticle to be fixed to the surface of the metal oxide nanoparticle.

FIG. 4 is a diagram schematically illustrating a reaction scheme in which, when the hole transport material 2a is a metal oxide nanoparticle, trisilanol obtained by the hydrolysis of a trialkoxysilane reacts with a hydroxy group on a surface of the metal oxide nanoparticle to be fixed to the surface of the metal oxide nanoparticle.

Figure 5:
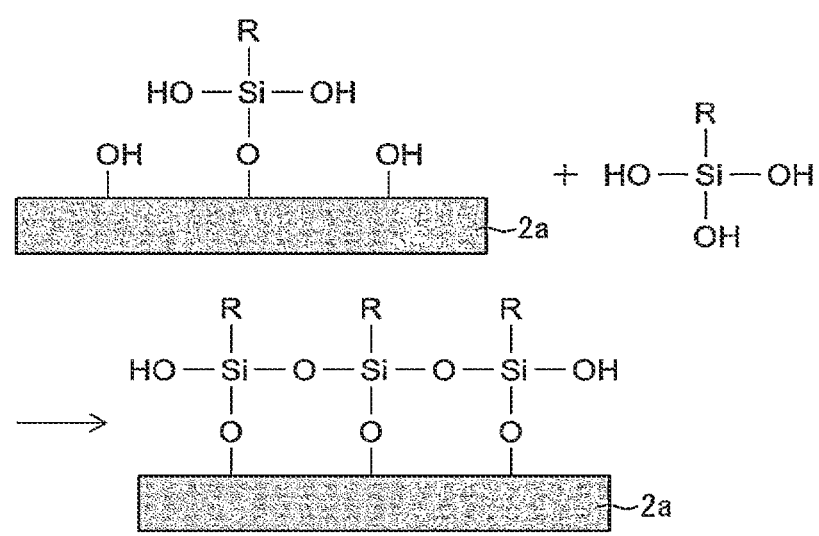
FIG. 5 is a diagram schematically illustrating a reaction scheme in which trisilanol forms polysilsesquioxane by self-condensation while being fixed to a surface of a metal oxide nanoparticle.

As illustrated in FIG. 4, when a silanol (—SiOH) group is produced by the hydrolysis of the trialkoxysilane, the silanol group is adsorbed to the hydroxy group on the surface of the metal oxide nanoparticle, as illustrated in FIG. 5. Thereafter, for example, by performing heat treatment, the silanol group adsorbed to the hydroxy group on the surface of the metal oxide nanoparticle forms a siloxane bond by dehydration condensation, and is fixed to the surface of the metal oxide nanoparticle. This makes it possible to remove the hydroxy group on the surface of the metal oxide nanoparticle.

Meanwhile, as illustrated in FIG. 3, the trisilanol obtained by the hydrolysis of the trialkoxysilane forms PSQ by self-condensation.

FIG. 5 is a diagram schematically illustrating a reaction scheme in which, when the hole transport material 2a is a metal oxide nanoparticle, trisilanol obtained by the hydrolysis of a trialkoxysilane forms PSQ by self-condensation while being fixed to the surface of the metal oxide nanoparticle.

As illustrated in FIG. 5, while the trisilanol obtained by the hydrolysis of the trialkoxysilane experiences dehydration condensation with the hydroxy group on the surface of the metal oxide nanoparticle when heated, for example, the trisilanol experiences dehydration condensation with each other (that is, the silanes including hydroxy groups experience dehydration condensation with each other). With this, PSQ or silanol, which is a precursor of the PSQ (a monomer, oligomer, or the like), is fixed to the surface of the metal oxide nanoparticle. The trialkoxysilane and a molecule (silanol as a precursor of the PSQ) obtained by the condensation of the trialkoxysilane are soluble even in a state where the polymerization has progressed to some extent, and are bonded to the surface of oxide such as a metal oxide nanoparticle.

In FIG. 5, a case in which the hole transport material 2a is a metal oxide nanoparticle is exemplified and illustrated, and a case in which the electron transport material 4a is a metal oxide nanoparticle is the same as the case in FIG. 5.

As previously mentioned, the hydrolysis is performed in a solution. Accordingly, when the hydrolysis described above is performed, for example, a dispersion liquid in which metal oxide nanoparticles are dispersed in a solvent, a monomer serving as a starting raw material of the first polymer 2b or second polymer 4b, and water and a catalyst for hydrolysis are added in a reaction vessel, and then the reaction vessel is sealed. Subsequently, the monomer is hydrolyzed while being stirred. A known stirring apparatus may be employed for the stirring.

Although the catalyst may be a base catalyst as described above, an acid catalyst such as a formic acid, hydrochloric acid, nitric acid or the like is suitably used as the catalyst discussed above.

As the solvent mentioned above, an organic solvent such as an alcohol solvent such as ethanol, toluene or the like is used.

An added amount of the catalyst to the monomer is preferably in a range from 0.1 to 10 Vol. % with respect to the above-described solvent.

The concentration of the metal oxide nanoparticles in the solvent is preferably in a range from 1 to 100 mg/ml with respect to the above solvent, because aggregation of the metal oxide nanoparticles occurs at high concentrations.

The mixing proportion of the above monomer to the metal oxide nanoparticles is, for example, the same as the ratio of the volume of the metal oxide nanoparticles and the volume of the first polymer 2b or second polymer 4b in the mixed film obtained finally. When the mixed film is made of a composite of the metal oxide nanoparticles and the first polymer 2b or second polymer 4b, the volume of the first polymer 2b or second polymer 4b with respect to the volume of the metal oxide nanoparticles is defined by the volume ratio of the metal oxide nanoparticles to the volume of the mixed film.

It is sufficient for the water for hydrolysis to use the water of the mol equal to that of the alkoxy group of the monomer.

It is sufficient that the reaction temperature and the reaction time in the hydrolysis are appropriately set in such a manner as to complete the reaction (that is, the hydrolysis). Accordingly, the reaction temperature in the hydrolysis is not particularly limited, but is preferably in a range from 0 to 100° C. in order to adjust the rate of the hydrolysis of the trialkoxysilane and the rate of the polymerization reaction. The reaction time in the hydrolysis preferably falls within a range from 1 to 48 hours in order that the hydroxy groups on the surfaces of the metal oxide nanoparticles are sufficiently subjected to the reaction.

The dehydration condensation occurs even at an ambient temperature, but rapidly progresses when heat is applied. Therefore, the dehydration condensation may be performed by heating at a temperature below the pyrolysis temperature of the PSQ after condensation. The PSQ in which the above-discussed R (that is, $R^1$ or $R^4$) is, for example, a methyl group or phenyl group, has a pyrolysis temperature of 450° C. Accordingly, in the step S2 and step S4, the mixed liquid may be heated at a temperature below 450° C. This makes it possible to protect a functional group represented by the above-discussed $R^1$ or $R^4$ so as to prevent the production of silica by pyrolysis of the methyl or phenyl group, and to rapidly progress the dehydration condensation.

The dehydration condensation progresses regardless of the acidity of the solvent. Therefore, dehydration condensation may be performed as it is after the hydrolysis described above. In this case, it is more preferable to use a low molecular weight catalyst such as a formic acid, ammonia or the like because the catalyst is unlikely to remain in the polymer by volatilization, washing, or the like.

The dehydration condensation is performed while maintaining the concentration of the metal oxide nanoparticles in the solvent and the concentration of PSQ and a compound as a precursor of the PSQ. Therefore, after the hydrolysis, the reaction vessel is opened, and the solvent is added in a dropwise manner to volatilize the catalyst and water while maintaining the concentration of the metal oxide nanoparticles and the concentration of the PSQ and the compound as the precursor of the PSQ.

The reaction time of the dehydration condensation is not particularly limited as long as the reaction time is appropriately set so as to complete the reaction (in other words, dehydration condensation), but preferably falls within a range from 1 to 48 hours in order to sufficiently perform the hydrolysis and dehydration condensation.

As described above, when the sol-gel method is used for forming the HTL 2, for example, a mixed liquid (sol) containing a composite of the metal oxide nanoparticles and the first polymer 2b is first applied to the position where the HTL 2 is to be formed on the anode electrode 1. Thereafter, the mixed liquid (sol) is baked or the like, then the dehydration condensation reaction is completed to make the sol become gel (having high molecular weight), and the solvent is completely removed to dry the gel, thereby solidifying the above-mentioned composite. As a result, a film made of a composite of the metal oxide nanoparticles and the first polymer 2b is formed as the HTL 2.

Likewise, when the sol-gel method is used for forming the ETL 4, a mixed liquid (sol) containing a composite of the metal oxide nanoparticles and the second polymer 4b is first applied to the position where the ETL 4 is to be formed on the EML 3. Thereafter, the mixed liquid (sol) is baked or the like, then the dehydration condensation reaction is completed to make the sot become gel (having high molecular weight), and the solvent is completely removed to dry the gel, thereby solidifying the above-mentioned composite. As a result, a film made of a composite of the metal oxide nanoparticles and the second polymer 4b is formed as the ETL 4.

Advantageous Effects

As described above, the light-emitting element 10 according to the present embodiment is such that the HTL 2 includes the hole transport material 2a, and the first polymer 2b containing a polysiloxane bond in the main chain and having a functional group including a π-conjugated electron pair in a side chain of the first polymer 2b. Due to this, as illustrated in FIG. 1, in the HTL 2, the positive holes not only perform hopping conduction directly from the hole transport material 2a to another hole transport material 2a, but also perform stepwise hopping conduction in between via a functional group including a π-conjugated electron pair in the side chain of the first polymer 2b. In other words, according to the present embodiment, when the positive holes perform hopping conduction from the hole transport material 2a to another hole transport material 2a, it is possible to perform hopping conduction once from the hole transport material 2a to the functional group, and then perform hopping conduction from the functional group to the above described another hole transport material 2a. This improves the hole mobility of the HTL 2.

Meanwhile, the light-emitting element 10 according to the present embodiment is such that the ETL 4 includes the electron transport material 4a, and the second polymer 4b containing a polysiloxane bond in the main chain and including a 1 to 10 carbon alkyl group in which no substitution is made or some hydrogen atoms are substituted in a side chain of the second polymer 4b. Due to this, as illustrated in FIG. 1, in the ETL 4, the electrons move by direct hopping conduction from the electron transport material 4a to another electron transport material 4a.

As discussed above, according to the present embodiment, by using different polymers for the first polymer 2b and the second polymer 4b (specifically, by changing the functional group as described above), it is possible to adjust the frequency of the hopping conduction of the carrier, and control a carrier mobility of the HTL 2 and the ETL 4.

In particular, an electroluminescent element generally tends to have a low carrier mobility in the HTL as compared to the ETL. Thus, the amount of electron injection is greater than the amount of positive hole injection in the EML, thereby typically raising a problem of excessive electron supply and positive hole shortage.

According to the present embodiment, by causing the frequency of the hopping conduction of the positive holes in the HTL 2 to be higher than the frequency of the hopping conduction of the electrons in the ETL 4, it is possible to promote the hole injection and suppress the electron injection. As described above, according to the present embodiment, since the electrical conductivity of the HTL 2 and the electrical conductivity of the ETL 4 formed of the carrier transport materials having different carrier mobilities can be aligned, and the carrier mobilities thereof can be aligned, the carrier balancing between the positive holes and the electrons may be improved. As a result, according to the present embodiment, the recombination probability between positive holes and electrons may be improved as compared to techniques in the related art, and the luminous efficiency may be improved as compared to the techniques in the related art.

According to the present embodiment, since the first polymer 2b and the second polymer 4b each include PSQ as the main component, durability is improved and film formability is also improved, thereby making it possible to suppress generation of pinholes. Furthermore, since the first polymer 2b and the second polymer 4b each include PSQ as the main component, it is possible to suppress extinction derived from the hydroxy groups on the surfaces of the metal oxide nanoparticles when the metal oxide nanoparticles are used for the hole transport material 2a and the electron transport material 4a. This makes it possible to provide the light-emitting element 10 having a high external quantum efficiency.

The first polymer 2b and the second polymer 4b are chemically bonded to the metal oxide nanoparticles, for example, to form a thin polymeric coating film. Due to this, a drive voltage is not raised, so that a device with a low drive voltage may be fabricated.

Moreover, according to the present embodiment, the HTL 2 and ETL 4 may be easily formed by the application process in the manner described above. This makes it possible to suppress the manufacturing cost.

Contents of Electron Transport Material 4a and Second Polymer 4b in ETL 4

Next, the volume ratio of the electron transport materials 4a to the volume of the mixed film as the content of the electron transport materials 4a in the ETL 4 will be described below with reference to FIG. 6. In the following, a case where the electron transport material 4a is a semiconductor nanoparticle (specifically, a metal oxide nanoparticle) and the second polymer 4b is PSQ represented by the structural formula (10) is exemplified and explained.

The volume of the electron transport materials 4a (semiconductor nanoparticles) and the volume of the second polymer 4b may be determined by dividing the weight of the electron transport materials 4a and the weight of the second polymer 4b contained in the mixed liquid by each of the corresponding densities (weight per unit volume). For example, the density of PSQ where a functional group including a π-conjugated electron pair is a phenyl group is 1.56 g/cm$^3$ and the density of ZnO is 5.61 g/cm$^3$.

Here, it is assumed that the sum of the volume of the semiconductor nanoparticles and the volume of the polymer is the volume of the mixed film made of these semiconductor nanoparticles and the polymer, and that the semiconductor nanoparticles are uniformly dispersed in the mixed film. In this case, a distance between number average semiconductor nanoparticles in the mixed film (hereinafter referred to as a "distance between nanoparticles") may be approximately expressed as shown in FIG. 6.

The distance between nanoparticles indicates a value obtained by subtracting the number average particle size of the semiconductor nanoparticles from a distance between the average particle centers of the semiconductor nanoparticles. The distance between the average particle centers of the semiconductor nanoparticles may be measured by small angle X-ray scattering of a film containing the semiconductor nanoparticles or by using a TEM. The number average particle size of the semiconductor nanoparticles may be measured by dynamic light scattering or by using the TEM as described above. The number average particle size of the semiconductor nanoparticles indicates the diameter of the semiconductor nanoparticle at 50% of the integrated value in the particle size distribution as described before.

Figure 6:
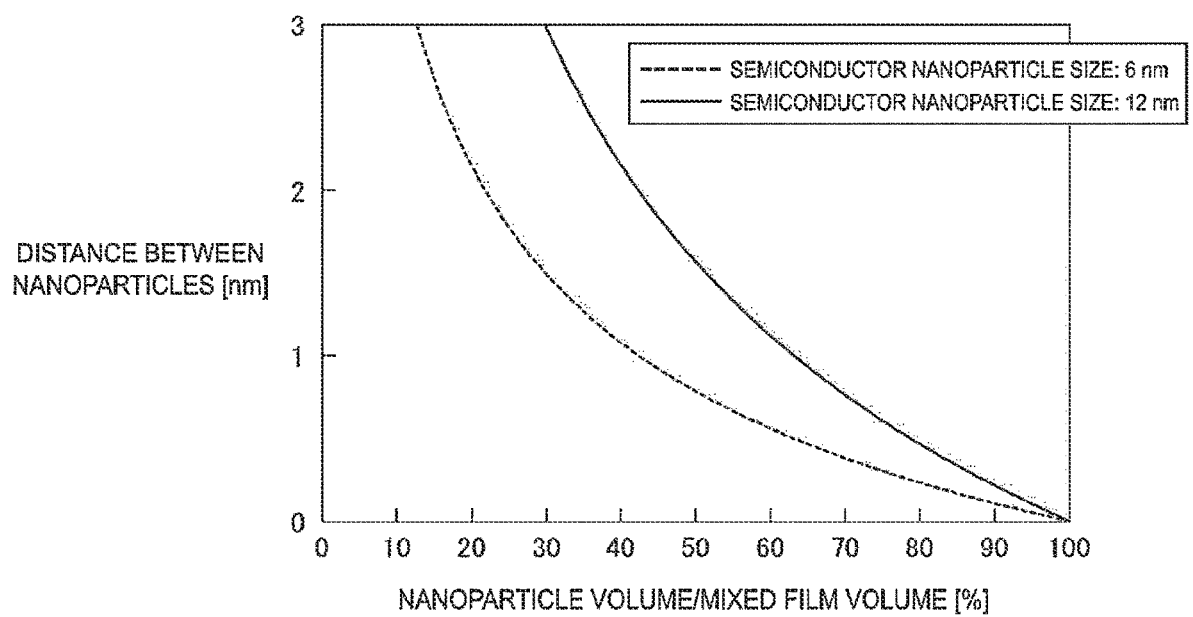
FIG. 6 is a graph showing a relationship between the ratio of a volume of semiconductor nanoparticles to a volume of a mixed film constituting an ETL, and the distance between adjacent semiconductor nanoparticles.

In FIG. 6, "nanoparticle volume/mixed film volume" indicates the ratio of the volume of the semiconductor nanoparticles to the volume of the mixed film. In FIG. 6, "semiconductor nanoparticle size" indicates the above-mentioned "number average particle size of the semiconductor nanoparticles".

When the semiconductor nanoparticles are assumed to have a spherical shape, gaps are generated even in a hexagonal close-packed structure, and the ratio of the volume of the semiconductor nanoparticles to the volume of the mixed film is, when the volume of the gaps is included in the volume of the mixed film, approximately 74% at most (because the semiconductor nanoparticles make contact with each other). FIG. 6 shows a graph in which the volume of the gaps is subtracted from the volume of the mixed film.

In an integrated film of semiconductor nanoparticles such as metal oxide nanoparticles, carrier movement occurs due to hopping conduction of the carrier by the tunnel effect. A tunnel current between the semiconductor nanoparticles each covered with an insulator as in the ETL 4 is likely to be generated as the distance between nanoparticles is shorter. More specifically, the tunnel current is generally generated when the distance between nanoparticles is not greater than 3 nm. The tunnel current is particularly likely to be generated when the distance between nanoparticles is not greater than 1.5 nm.

The second polymer 4b is an insulator having a large band gap; the second polymer 4b cannot be used as a carrier transport material, but a composite of the semiconductor nanoparticle and the second polymer 4b may be used as a carrier transport material.

In FIG. 6, ZnO nanoparticles are used for the semiconductor nanoparticles. Accordingly, FIG. 6 shows the relationship between the ratio of the volume of the electron transport materials 4a to the volume of the mixed film including the electron transport materials 4a (semiconductor nanoparticles) and the second polymer 4b forming the ETL 4, and the distance between the number average semiconductor nanoparticles in the mixed film. The term "distance between nanoparticles" indicated in FIG. 6 (in other words, the distance between the number average semiconductor nanoparticles) corresponds to the distance d2 between the electron transport materials 4a adjacent to each other in the ETL 4 indicated in FIG. 1. The term "the distance between number average metal oxide nanoparticles" (to rephrase, the distance between number average particles between fine particles of adjacent metal oxides) may be read for the term "the distance between the number average semiconductor nanoparticles" or "distance between nanoparticles".

FIG. 6 shows approximate calculation results telling a rough relation between the volume ratio of the semiconductor nanoparticles to the volume of the mixed film including the semiconductor nanoparticles and the second polymer 4b, and the average distance between the adjacent semiconductor nanoparticles in the mixed film including the semiconductor nanoparticles and the second polymer 4b. Accordingly, from FIG. 6, a rough relation between the content of the second polymer 4b covering the semiconductor nanoparticles and the average distance between the adjacent semiconductor nanoparticles is understood.

As described above, the tunnel current is likely to be generated when the distance between the semiconductor nanoparticles is 3 nm or less. Therefore, in order for the mixed film to have the carrier mobility, the distance between nanoparticles is required to be 3 nm or less. As shown in FIG. 6, in order for the distance between nanoparticles to be less than or equal to 3 nm, the volume ratio of the semiconductor nanoparticles to the volume of the mixed film (in other words, the ETL 4 formed of the mixed film) is preferably 15% or greater, and more preferably 30% or greater.

On the other hand, when the volume ratio of the semiconductor nanoparticles to the volume of the mixed film is large, hydroxy groups on the surfaces of the semiconductor nanoparticles remain without being reacted. Because of this, it is preferable for the volume ratio of the semiconductor nanoparticles to the volume of the mixed film to be not greater than 90%, and more preferable to be not greater than 80%.

Therefore, the ratio of the volume of the electron transport materials 4a to the volume of the mixed film (in other words, the volume of the ETL 4) is preferably not less than 15% and not more than 90%. The lower limit value of the ratio of the volume of the electron transport materials 4a to the volume of the mixed film is more preferably 30%, and the upper limit value thereof is more preferably 80%.

While reducing the remaining quantity of the hydroxy groups with the above ratio being less than or equal to 90%, it is possible to obtain a favorable carrier mobility (electron mobility in the present embodiment) with the ratio being more than or equal to 15%.

As described above, the mixing proportion of the electron transport materials 4a and the second polymer 4b (the electron transport materials 4a:the second polymer 4b) in the ETL 4 is preferably in a range from 15:85 to 90:10, and more preferably in a range from 30:70 to 80:30 in terms of a volume ratio.

ZnO nanoparticles being electron transport materials are used for the semiconductor nanoparticles in FIG. 6, and similar results to those shown in FIG. 6 may also be obtained when hole transport materials are used for the semiconductor nanoparticles. Thus, the mixing proportion of the hole transport materials 2a and the first polymer 2b (the hole transport materials 2a:the first polymer 2b) in the HTL 2 is also preferably in a range from 15:85 to 90:10, and more preferably in a range from 30:70 to 80:30 in terms of a volume ratio.

In the case where the ETL 4 includes the other materials described above, the content of the other materials in the ETL 4 is preferably 20% or less, and more preferably 10% or less in the volume ratio, in order not to obstruct the condensation of the polymer.

Furthermore, the distance d2 between the adjacent electron transport materials 4a (the distance between nanoparticles) in the ETL 4 is preferably less than or equal to 3 nm, and more preferably less than or equal to 1.5 nm for the reason described above.

As described above, in the HTL 2, hopping conduction of positive holes can be performed via a functional group including a π-conjugated electron pair in the first polymer 2b. Therefore, in the HTL 2, it is also possible to lengthen the distance between nanoparticles as compared to the ETL 4, for example. That is, a distance d1 between the adjacent hole transport materials 2a (the distance between nanoparticles) in the HTL 2, as illustrated in FIG. 1, may be greater than the distance d2 between the adjacent electron transport materials 4a in the ETL 4.

Specifically, the distance d1 between the adjacent hole transport materials 2a in the HTL 2 is preferably less than or equal to 5 nm, and more preferably less than or equal to 3 nm. In the case where the distance d1 between the adjacent hole transport materials 2a in the HTL 2 is 5 nm or less, hopping conduction of the positive holes may be performed via a functional group including a π-conjugated electron pair in the first polymer 2b, and the frequency of hopping conduction of the carrier may be increased over the ETL 4.

First Modified Example

In the present embodiment, a case in which the EML 3 is a quantum dot light-emitting layer including a quantum dot as a light-emitting material is exemplified and explained.

In a known light-emitting element equipped with a quantum dot light-emitting layer, when metal oxide nanoparticles are used in a carrier transport layer, the deactivation of quantum dots by hydroxy groups on the surfaces of the metal oxide nanoparticles prominently occurs. However, according to the present embodiment, it is possible to prevent the deactivation of the quantum dots.

However, the EML 3 is not limited to a quantum dot light-emitting layer. The EML 3 may include, as a light-emitting material, an organic light-emitting material for emitting colors of light in place of the quantum dot, for example.

In a case in which the light-emitting element 10 is a QLED using quantum dots as the light-emitting material as described above, the electrons and the positive holes are recombined in the EML 3 by a drive current between the anode electrode 1 and the cathode electrode 5. Then, when excitons generated by the recombination transition from a quantum dot conduction band level to a valence band level, light (fluorescence) is emitted.

On the other hand, in a case in which the light-emitting element 10 is an OLED using an organic light-emitting material as the light-emitting material, the electrons and the positive holes are recombined in the EML 3 by a drive current between the anode electrode 1 and the cathode electrode 5, and light is emitted when excitons generated by the recombination transition to a ground state.

The light-emitting element 10 may be a light-emitting element (for example, an inorganic light-emitting diode) other than the OLED and QLED.

Second Modified Example

In FIG. 1, a case where the light-emitting element 10 has a configuration in which the anode electrode 1, the HTL 2 (first layer), the EML 3, the ETL 4 (second layer), and the cathode electrode 5 are layered in that order from the lower layer side, is exemplified and explained. However, the present embodiment is not limited to this example. The light-emitting element 10 may have a configuration in which the cathode electrode 5, the ETL 4 (second layer), the EML 3, the HTL 2 (first layer), and the anode electrode 1 are layered in that order from the lower layer side. As an intermediate layer between the cathode electrode 5 and the EML 3, an HIL and the ETL 4 may be provided in that order between the cathode electrode 5 and the EML 3 from the cathode electrode 5 side. For example, an EIL may be separately provided between the anode electrode 1 and the HTL 2 as an intermediate layer between the anode electrode 1 and the HTL 2. In any case, similar advantageous effects to those described above may be obtained.

Second Embodiment

Differences from the first embodiment will be described in the present embodiment. Note that, for convenience of description, components having the same function as the components described in the first embodiment are designated by the same reference numbers, and descriptions thereof are omitted.

Figure 7:
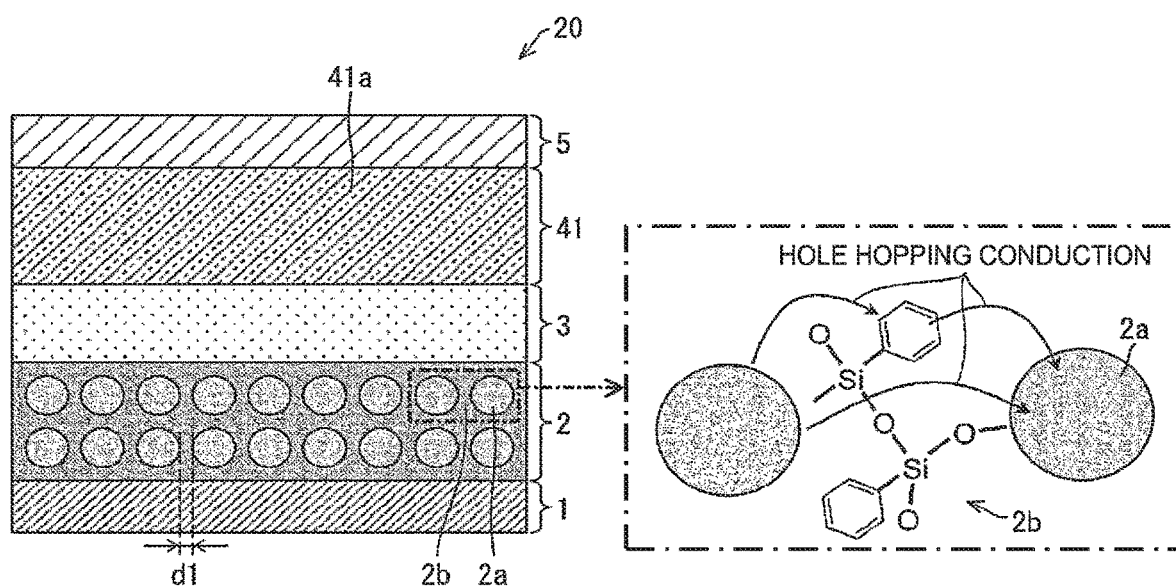
FIG. 7 is a cross-sectional view illustrating an example of an overall configuration of a light-emitting element according to a second embodiment along with a diagram in which a main portion of the light-emitting element is enlarged and schematically illustrated.

FIG. 7 is a cross-sectional view illustrating an example of an overall configuration of a light-emitting element 20 according to the present embodiment along with a diagram in which a main portion of the light-emitting element 20 is enlarged and schematically illustrated.

The light-emitting element 20 illustrated in FIG. 7 has a configuration in which an anode electrode 1, an HTL 2 (first layer), an EML 3, an ETL 41, and a cathode electrode 5 are layered in that order from the lower layer side.

As illustrated in FIG. 7, the light-emitting element 20 according to the present embodiment differs from the light-emitting element 10 according to the first embodiment only in a point that the ETL 41 is provided instead of the ETL 4.

The ETL 41, similar to the ETL 4, is a layer for transporting electrons to the EML 3, and is provided in contact with the EML 3. The ETL 41, similar to the ETL 4, may have a function of inhibiting the transport of positive holes.

The ETL 41 differs from the ETL 4 in that the second polymer 4b is not included therein. That is, the ETL 41 includes an electron transport material 41a as a carrier transport material (second carrier transport material). The electron transport material 41a may use any of various known electron transport materials. Accordingly, the electron transport material 41a may be the same as the electron transport material 4a. As the electron transport material 41a, an organic electron transport material, such as oxadiazoles, triazoles, phenanthrolines, a silole derivative, a cyclopentadiene derivative or the like, may be used. Examples of the derivatives of the oxadiazole include (2-(4-biphenylyl)-5-(4-tert-butylphenyl)-1,3,4-oxadiazole) (PBD) and the like. One type of electron transport materials may be used, or two or more types thereof may be mixed and used as appropriate.

As described before, an electroluminescent element generally tends to have a low carrier mobility in the HTL as compared to the ETL. Thus, the amount of electron injection is greater than the amount of positive hole injection in the EML, thereby typically raising a problem of excessive electron supply and positive hole shortage.

As described in the first embodiment, since the HTL 2 includes the hole transport material 2a and the first polymer 2b, it is possible to increase the frequency of the hole hopping conduction as compared to the techniques in the related art, and improve the hole mobility in the HTL 2.

Therefore, according to the present embodiment, although it is not possible to control the electron injection in the ETL 41, it is possible to promote the hole injection in the HTL 2. In other words, according to the present embodiment, by the first polymer 2b, the frequency of the hopping conduction of the carrier may be adjusted and the carrier mobility in the HTL 2 may be controlled. Accordingly, in the present embodiment as well, carrier balancing between the positive holes and the electrons may be improved as compared to the techniques in the related art. As a result, also in the present embodiment, the recombination probability between the positive holes and electrons may be improved as compared to the techniques in the related art, and the luminous efficiency may be improved as compared to the techniques in the related art.

Modified Example

In FIG. 7, a case in which the light-emitting element 20 includes the ETL 41 is exemplified and illustrated. However, the light-emitting element 20 according to the present embodiment is not limited to the configuration illustrated in FIG. 7. It is acceptable that the light-emitting element 20 has a configuration including no ETL. As an intermediate layer between the cathode electrode 5 and the EML 3, an EIL and the ETL 41 may be provided in that order from the cathode electrode 5 side between the cathode electrode 5 and the EML 3. For example, an HIL may be separately provided between the anode electrode 1 and the HTL 2 as an intermediate layer between the anode electrode 1 and the HTL 2.

Third Embodiment

Differences from the first and the second embodiments will be described in the present embodiment. Note that, for convenience of description, components having the same function as the components described in the first and the second embodiments are designated by the same reference numbers, and descriptions thereof are omitted.

Figure 8:
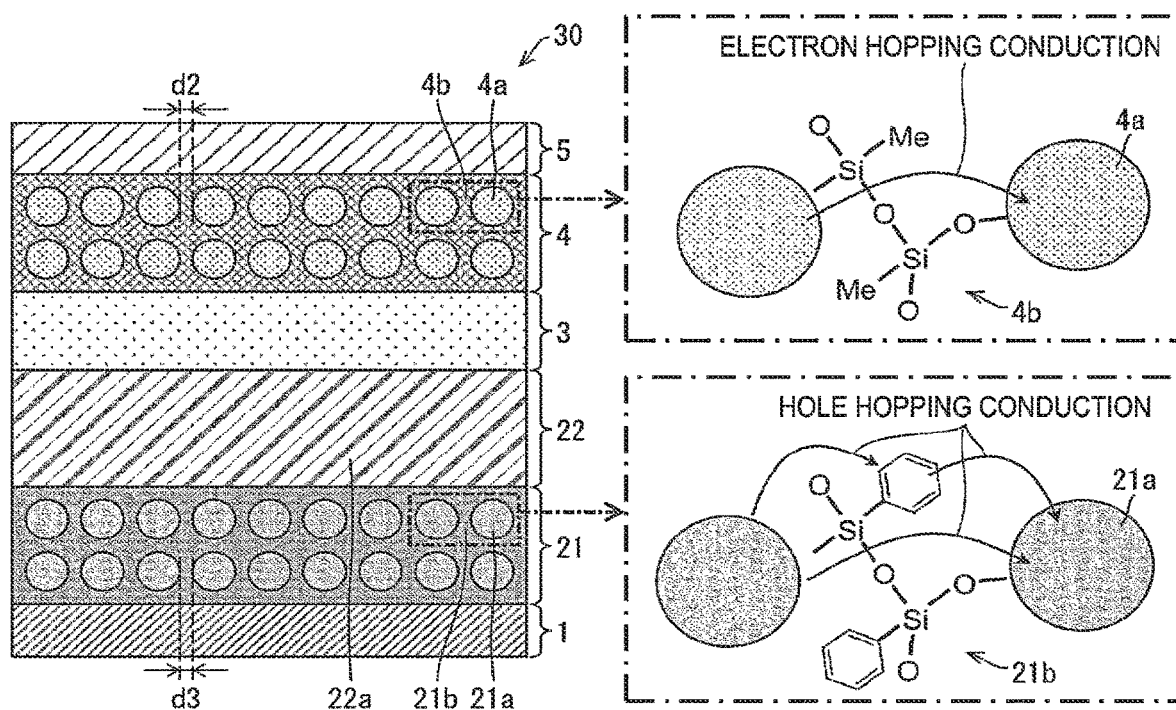
FIG. 8 is a cross-sectional view illustrating an example of an overall configuration of a light-emitting element according to a third embodiment along with diagrams, in each of which a main portion of the light-emitting element is enlarged and schematically illustrated.

FIG. 8 is a cross-sectional view illustrating an example of an overall configuration of a light-emitting element 30 according to the present embodiment along with diagrams, in each of which a main portion of the light-emitting element 30 is enlarged and schematically illustrated.

The light-emitting element 30 illustrated in FIG. 8 has a configuration in which an anode electrode 1, an HIL 21 (first layer), an HTL 22, an EML 3, an ETL 4 (second layer), and a cathode electrode 5 are layered in that order from the lower layer side.

In the first and second embodiments, the case in which the first layer is a hole transport layer is exemplified and explained. However, in order to adjust carrier balancing, it is sufficient for the first layer to be provided between the first electrode and the EML. Therefore, when the first electrode is an anode electrode and the first layer is a layer having hole transport properties, the first layer is not necessarily required to be an HTL, and may be an HIL.

The light-emitting element 30 illustrated in FIG. 8 differs from the light-emitting element 10 according to the first embodiment only in a point that the HIL 21 and HTL 22 are provided instead of the HTL 2.

The HIL 21 is a layer for transporting positive holes to the HTL 22, and the HTL 22 is a layer, similar to the HTL 2, for transporting electrons to the EML 3. The HIL 21 or HTL 22 may have a function of inhibiting the transport of electrons.

The HIL 21 includes a hole transport material 21a as a carrier transport material (first carrier transport material) and also includes a first polymer 21b as a binder, as illustrated in FIG. 8. The same material as that of the hole transport material 2a may be used as the hole transport material 21a. As the first polymer 21b, the same material as that of the first polymer 2b may be used. Accordingly, a distance d3 between the adjacent hole transport materials 21a (the distance between nanoparticles) in the HIL 21 may be set similar to the distance d1 between the adjacent hole transport materials 2a in the HTL 2.

The HTL 22 differs from the HTL 2 in that the first polymer 2b is not included therein. That is, the HTL 22 includes a hole transport material 22a as a carrier transport material (third carrier transport material). The hole transport material 22a may use any of various known hole transport materials. Accordingly, the hole transport material 22a may be the same as the hole transport material 2a. As the hole transport material 22a, an organic hole transport material, such as poly(3,4-ethylenedioxythiophene)-poly(4-styrenesulfonate) (PEDOT:PSS), polyvinylcarbazole (PVK), poly[(9,9-dioctylfluorenyl-2,7-diyl)-co-(4,4'-(N-4-sec-butylphenyl))diphenylamine)] (TFB) and the like, may be used. These hole transport materials may be used alone or may be used in combination of two or more as appropriate.

The light-emitting element 30 according to the present embodiment is such that the HIL 21a includes the hole transport material 21a, and the first polymer 21b containing a polysiloxane bond in the main chain and having a functional group including a π-conjugated electron pair in a side chain of the first polymer 21b. Due to this, as illustrated in FIG. 8, in the HIL 21, the positive holes not only perform hopping conduction directly from the hole transport material 21a to another hole transport material 21a, but also perform stepwise hopping conduction in between via a functional group including a π-conjugated electron pair in the side chain of the first polymer 21b. In other words, when the positive holes perform hopping conduction from the hole transport material 21a to another hole transport material 21a, it is possible to perform hopping conduction once from the hole transport material 21a to the functional group, and then perform hopping conduction from the functional group to the above described another hole transport material 21a. This improves a hole mobility of the HIL 21.

Meanwhile, the light-emitting element 30 according to the present embodiment is such that the ETL 4 includes an electron transport material 4a, and a second polymer 4b containing a polysiloxane bond in the main chain and including a 1 to 10 carbon alkyl group in which no substitution is made or some hydrogen atoms are substituted in a side chain of the second polymer 4b. Due to this, as illustrated in FIG. 8, in the ETL 4, the electrons move by direct hopping conduction from the electron transport material 4a to another electron transport material 4a.

As discussed above, according to the present embodiment, by using different polymers for the first polymer 21b and the second polymer 4b (specifically, by changing the functional group as described above), it is possible to adjust the frequency of the hopping conduction of the carrier, and control a carrier mobility of the HIL 21 and the ETL 4.

According to the present embodiment, by causing the frequency of the hopping conduction of the positive holes in the HIL 21 to be higher than the frequency of the hopping conduction of the electrons in the ETL 4, it is possible to promote the hole injection and suppress the electron injection. Thus, as in the first embodiment, in the present embodiment as well, the amounts of the positive holes and electrons injected into the EML 3 may be aligned, so that the carrier balancing between the positive holes and electrons may be improved. As a result, according to the present embodiment, the recombination probability between positive holes and electrons may be improved as compared to techniques in the related art, and luminous efficiency may be improved as compared to the techniques in the related art.

According to the present embodiment as well, when the first polymer 21b and the second polymer 4b each include PSQ as a main component, durability is improved and film formability is also improved, thereby making it possible to suppress generation of pinholes. Furthermore, also in the present embodiment, since the second polymer 4b includes PSQ as the main component, it is possible to suppress the extinction derived from the hydroxy groups on the surfaces of the metal oxide nanoparticles when the metal oxide nanoparticles are used for the electron transport materials 4a. This makes it possible to provide the light-emitting element 30 having high external quantum efficiency.

The first polymer 21b and the second polymer 4b are chemically bonded to the metal oxide nanoparticles, for example, to form a thin polymeric coating film. Due to this, a drive voltage is not raised, so that a device with a low drive voltage may be fabricated.

In the present embodiment as well, the HIL 21 and ETL 4 may be easily formed by an application process. This makes it possible to suppress the manufacturing cost.

First Modified Example

In FIG. 8, a case in which the HIL 21 and the HTL 22 are provided in place of the HTL 2 in the light-emitting element 10 illustrated in FIG. 1 is exemplified and illustrated. However, the present embodiment is not limited to this example. The light-emitting element 30 according to the present embodiment may have a configuration in which the HIL 21 and HTL 22 are provided in place of the HTL 2 in the light-emitting element 20 illustrated in FIG. 7, for example. In this case, a light-emitting element exhibiting both the advantageous effects according to the present embodiment and the advantageous effects according to the second embodiment may be provided. Obviously, similar modifications to those of the first and second embodiments may also be carried out in the present embodiment.

Second Modified Example

As described above, in order to adjust the carrier balancing, it is sufficient for the first layer to be provided between a first electrode and an EML. Accordingly, when the first electrode is an anode electrode and the first layer is a layer having hole transport properties, the HIL and the HTL may each include a hole transport material, and a first polymer containing a polysiloxane bond in the main chain and having a functional group including a π-conjugated electron pair in a side chain of the first polymer. In other words, at least one first layer may be provided between the first electrode and the EML, or a plurality of first layers may be provided therebetween.

Likewise, when the second electrode is a cathode electrode and the second layer is a layer having electron transport properties, the EIL and the ETL may each include an electron transport material, and a second polymer containing a polysiloxane bond in the main chain and having a 1 to 10 carbon alkyl group in which no substitution is made or some hydrogen atoms are substituted in a side chain of the second polymer. In other words, at least one second layer may be provided between the second electrode and the EML, or a plurality of second layers may be provided therebetween.

The EIL may be the second layer instead of the ETL illustrated in FIG. 1 or 8. That is, in FIG. 1 or FIG. 8, instead of the ETL 4, an EIL including an electron transport material and a second polymer, and an ETL including no second polymer may be provided in that order from the cathode electrode 5 side.

Fourth Embodiment

Differences from the first to the third embodiments will be described in the present embodiment. Note that, for convenience of description, components having the same function as the components described in the first to the third embodiments are designated by the same reference numbers, and descriptions thereof are omitted.

In the first to third embodiments, the case in which the first electrode is the anode electrode 1 and the second electrode is the cathode electrode 5 is exemplified and explained. However, the first electrode may be the cathode electrode 5 and the second electrode may be the anode electrode 1.

Carrier balancing varies depending on the material of each layer (functional layer) between the anode electrode 1 and the cathode electrode 5, and a combination of a layer thickness, an energy level and the like. Accordingly, when the amount of positive hole injection is larger than the amount of electron injection in the EML 3 (for example, a case of a combination with a low carrier mobility in an ETL as compared to an HTL), a first layer may be provided between the cathode electrode 5 and the EML 3. As described above, the first layer includes the first polymer containing a polysiloxane bond in the main chain and having a functional group including a π-conjugated electron pair in a side chain of a first polymer, and a first carrier transport material. In this case, an electron transport material is used for the first carrier transport material.

At this time, a second layer may be provided between the anode electrode 1 and the EML 3. As described above, the second layer includes the second polymer containing a polysiloxane bond in the main chain and having a 1 to 10 carbon alkyl group in which no substitution is made or some hydrogen atoms are substituted in a side chain of the second polymer, and a second carrier transport material. In this case, the hole transport material is used for the second carrier transport material.

Figure 9:
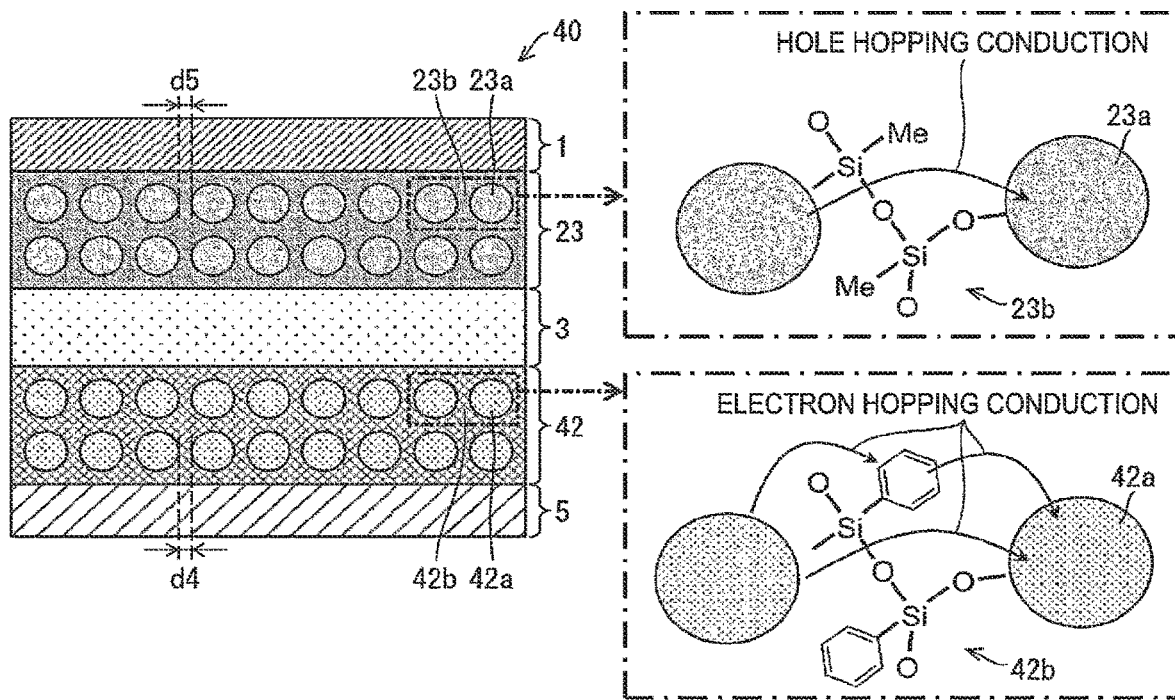
FIG. 9 is a cross-sectional view illustrating an example of an overall configuration of a light-emitting element according to a fourth embodiment along with diagrams, in each of which a main portion of the light-emitting element is enlarged and schematically illustrated.

FIG. 9 is a cross-sectional view illustrating an example of an overall configuration of a light-emitting element 40 according to the present embodiment along with diagrams, in each of which a main portion of the light-emitting element 40 is enlarged and schematically illustrated.

The light-emitting element 40 illustrated in FIG. 9 has the same configuration as the light-emitting element 10 according to the first embodiment except for the following points.

The light-emitting element 40 illustrated in FIG. 9 has a configuration in which a cathode electrode 5 (first electrode), an ETL 42 (first layer), an EML 3, an HTL 23 (second layer), and an anode electrode 1 are layered in that order from the lower layer side.

In the example illustrated in FIG. 9, the cathode electrode 5 is a lower electrode provided at the lower layer side, and the anode electrode 1 is an upper electrode provided at the upper layer side. Therefore, in the present embodiment, a direction extending from the cathode electrode 5 toward the anode electrode 1 is referred to as an upward direction, and the opposite direction thereto is referred to as a downward direction.

The ETL 42, similar to the ETL 4, is a layer for transporting electrons to the EML 3, and is provided in contact with the EML 3. The ETL 42, similar to the ETL 4, may have a function of inhibiting the transport of positive holes.

The ETL 42 includes an electron transport material 42a as a carrier transport material (first carrier transport material) and also includes a first polymer 42b as a binder, as illustrated in FIG. 9. The same material as that of the electron transport material 4a may be used as the electron transport material 42a. As the first polymer 42b, the same material as that of the first polymer 2b may be used.

The HTL 23, similar to the HTL 2, is a layer for transporting positive holes to the EML 3, and is provided in contact with the EML 3. The HTL 23, similar to the HTL 2, may have a function of inhibiting the transport of electrons.

The HTL 23 includes a hole transport material 23a as a carrier transport material (second carrier transport material) and also includes a second polymer 23b as a binder, as illustrated in FIG. 9. The same material as that of the hole transport material 2a may be used as the hole transport material 23a. As the second polymer 23b, the same material as that of the second polymer 4b may be used.

Accordingly, a distance d5 between the adjacent hole transport materials 23a (the distance between nanoparticles) in the HTL 23 may be set similar to the distance d2 between the adjacent electron transport materials 4a in the ETL 4.

A distance d4 between the adjacent electron transport materials 42a (the distance between nanoparticles) in the ETL 42 may be set similar to the distance d1 between the adjacent hole transport materials 2a in the HTL 2.

As described in the first embodiment, a tunnel current is generated when the distance between semiconductor nanoparticles is 3 nm or less. The tunnel current is particularly likely to be generated when the distance between nanoparticles is not greater than 1.5 nm. As illustrated in FIG. 9, in the HTL 23, positive holes move by direct hopping conduction from the hole transport material 23a to another hole transport material 23a. Accordingly, the distance d5 between the adjacent hole transport materials 23a in the HTL 23 is preferably less than or equal to 3 nm, and more preferably less than or equal to 1.5 nm.

In the present embodiment, as described above, the ETL 42 includes the first polymer 42b containing a polysiloxane bond in the main chain and having a functional group including a π-conjugated electron pair in a side chain of the first polymer 42b. Due to this, in the ETL 42, the electrons not only perform hopping conduction directly from the electron transport material 42a to another electron transport material 42a, but also perform stepwise hopping conduction in between via a functional group including a π-conjugated electron pair in the side chain of the first polymer 42b. In other words, when the electrons perform hopping conduction from the electron transport material 42a to another electron transport material 42a, it is possible to perform hopping conduction once from the electron transport material 42a to the functional group, and then perform hopping conduction from the functional group to the above described another electron transport material 42a.

Thus, the distance d4 between the adjacent electron transport materials 42a in the ETL 42, as illustrated in FIG. 9, may be greater than the distance d5 between the adjacent hole transport materials 23a in the HTL 23.

Specifically, as in the case of the distance d1, the distance d4 is preferably less than or equal to 5 nm, and more preferably less than or equal to 3 nm. In the case where the distance d4 is 5 nm or less, it is possible for the electrons to perform hopping conduction via a functional group including a π-conjugated electron pair in the first polymer 42b, and the frequency of hopping conduction of the carrier may be increased over the HTL 23.

As described with reference to FIG. 6 in the first embodiment, it is preferable for the volume ratio of the semiconductor nanoparticles to the volume of the mixed film including the semiconductor nanoparticles as the carrier transport materials and also including the polymer as the binder to be not less than 15%, and more preferable to be not less than 30%. Further, as described in the first embodiment, in consideration of the remainder of the hydroxy groups on the surfaces of the semiconductor nanoparticles, it is preferable for the volume ratio of the semiconductor nanoparticles to the volume of the mixed film to be not greater than 90%, and more preferable to be not greater than 80%. Thus, in the present embodiment, although the combination of the carrier transport material and the polymer differs from that in the first to third embodiments, the mixing proportion of the carrier transport material and the polymer is set to fall within the same range as the range in the first to third embodiments, in the layer containing the carrier transport material and the polymer.

A manufacturing method for the light-emitting element 40 according to the present embodiment is such that, in the manufacturing method for the light-emitting element 10 according to the first embodiment, it is sufficient to read the "cathode 5", "ETL 42", "HTL 23", "anode electrode 1", "electron transport material 42a", "first polymer 42b", "hole transport material 23a", and "second polymer 23b" for the "anode electrode 1", "HTL 2", "ETL 4", "cathode electrode 5", "hole transport material 2a", "first polymer 2b", "electron transport material 4a" and "second polymer 4b" in sequence.

According to the present embodiment, by using different polymers for the first polymer 42b and the second polymer 23b, it is possible to adjust the frequency of the hopping conduction and control the carrier mobility of the ETL 42 and the HTL 23.

According to the present embodiment, as discussed above, by causing the frequency of the hopping conduction in the ETL 42 to be higher than the frequency of the hopping conduction in the HTL 23, it is possible to promote the electron injection and suppress the hole injection. As describe above, according to the present embodiment, when the amount of positive hole injection is larger than the amount of electron injection in the EML 3 (for example, a case of a combination with a low carrier mobility in the ETL 42 as compared to the HTL 23), it is possible to increase the frequency of the electron hopping conduction and promote the electron injection. Thus, also in the present embodiment, the amounts of the positive holes and electrons injected into the EML 3 may be aligned, so that the carrier balancing between the positive holes and electrons may be improved. As a result, according to the present embodiment, the recombination probability between the positive holes and electrons may be improved as compared to techniques in the related art, and luminous efficiency may be improved as compared to the techniques in the related art.

According to the present embodiment as well, since the first polymer 42b and the second polymer 23b each include PSQ as a main component, durability is improved and film formability is also improved, thereby making it possible to suppress generation of pinholes. Furthermore, since the first polymer 42b and the second polymer 23b each include PSQ as the main component in the present embodiment, it is also possible to suppress the extinction derived from the hydroxy groups on the surfaces of the metal oxide nanoparticles when the metal oxide nanoparticles are used for the electron transport material 42a and the hole transport material 23a. This makes it possible to provide the light-emitting element 40 having high external quantum efficiency.

The first polymer 42b and the second polymer 23b are chemically bonded to the metal oxide nanoparticles, for example, to form a thin polymeric coating film. Due to this, a drive voltage is not raised, so that a device with a low drive voltage may be fabricated.

In the present embodiment as well, the ETL 42 and HTL 23 may be easily formed by an application process. This makes it possible to suppress the manufacturing cost.

Fifth Embodiment

Differences from the fourth embodiment will mainly be described in the present embodiment. For convenience of description, components having the same functions as the components described in the fourth embodiment are designated by the same reference numbers, and detailed descriptions thereof are omitted.

Figure 10:
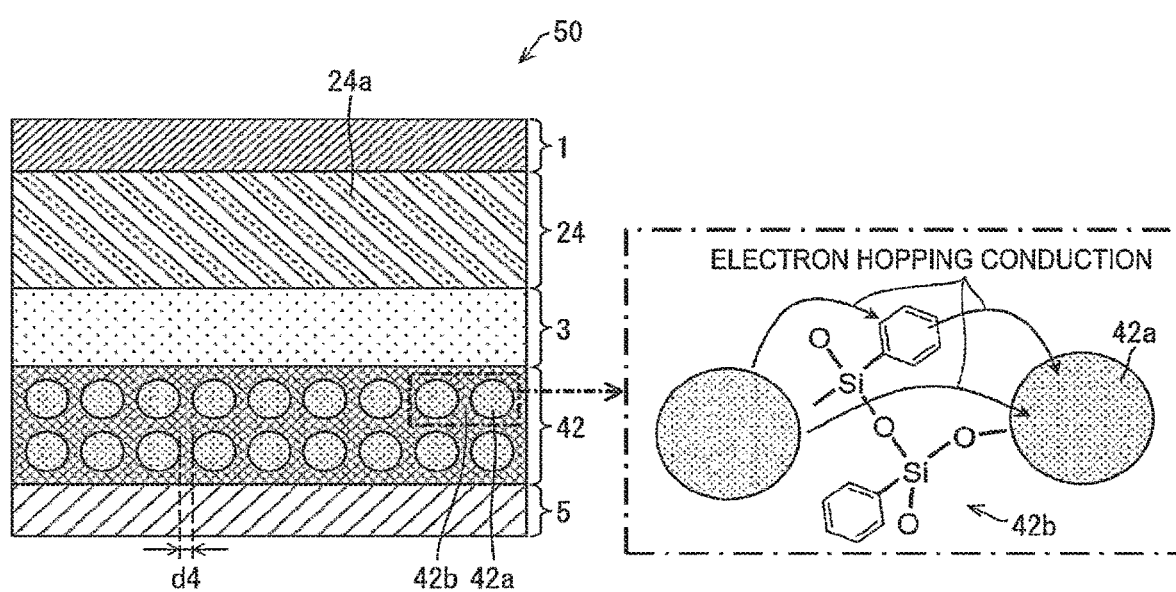
FIG. 10 is a cross-sectional view illustrating an example of an overall configuration of a light-emitting element according to a fifth embodiment along with a diagram in which a main portion of the light-emitting element is enlarged and schematically illustrated.

FIG. 10 is a cross-sectional view illustrating an example of an overall configuration of a light-emitting element 50 according to the present embodiment along with a diagram in which a main portion of the light-emitting element 50 is enlarged and schematically illustrated.

The light-emitting element 50 illustrated in FIG. 10 has a configuration in which a cathode electrode 5, an ETL 42 (first layer), an EML 3, an HTL 24, and an anode electrode 1 are layered in that order from the lower layer side.

The light-emitting element 50 according to the present embodiment differs from the light-emitting element 40 according to the fourth embodiment only in a point that the HTL 24 is provided instead of the HTL 23, as illustrated in FIG. 10.

The HTL 24, similar to the HTL 23, is a layer for transporting positive holes to the EML 3, and is provided in contact with the EML 3. The HTL 24, similar to the HTL 23, may have a function of inhibiting the transport of positive holes.

The HTL 24 differs from the HTL 23 in that the second polymer 23b is not included therein. That is, the HTL 24 includes a hole transport material 24a as a carrier transport material (second carrier transport material). The same material as that of the hole transport material 22a according to the third embodiment may be used as the hole transport material 24a.

According to the present embodiment, as described in the fourth embodiment, since the ETL 42 includes an electron transport material 42a and the first polymer 42b, it is possible to increase the frequency of the electron hopping conduction as compared to the techniques in the related art, and improve an electron mobility in the ETL 42.

Therefore, according to the present embodiment, although it is not possible to control hole injection in the HTL 24, it is possible to promote the electron injection in the ETL 42. In other words, according to the present embodiment, by the first polymer 42b, the frequency of the hopping conduction of a carrier may be adjusted and a carrier mobility in the ETL 42 may be controlled. Accordingly, in the present embodiment as well, the carrier balancing between the positive holes and the electrons may be improved as compared to the techniques in the related art. As a result, also in the present embodiment, the recombination probability between the positive holes and electrons may be improved as compared to the techniques in the related art, and luminous efficiency may be improved as compared to the techniques in the related art.

Modified Example

In FIG. 10, a case in which the light-emitting element 50 includes the HTL 24 is exemplified and illustrated. However, the light-emitting element 50 according to the present embodiment is not limited to the configuration illustrated in FIG. 10. It is acceptable that the light-emitting element 50 has a configuration including no HTL. As an intermediate layer between the anode electrode 1 and the EML 3, an HIL and the HTL 24 may be provided in that order between the anode electrode 1 and the EML 3 from the anode electrode 1 side. For example, an EIL may be separately provided between the cathode electrode 5 and the ETL 42 as an intermediate layer between the cathode electrode 5 and the ETL 42.

Sixth Embodiment

Differences from the fourth and fifth embodiments will mainly be described in the present embodiment. For convenience of description, components having the same functions as the components described in the fourth and fifth embodiments are designated by the same reference numbers, and detailed descriptions thereof are omitted.

Figure 11:
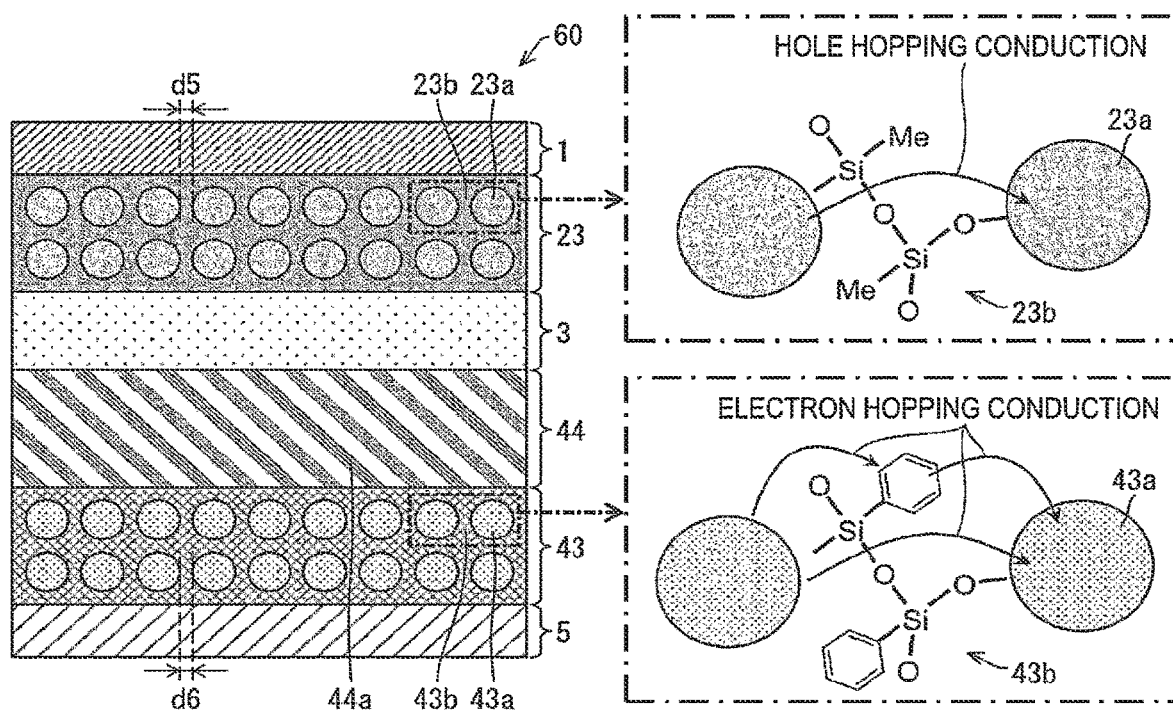
FIG. 11 is a cross-sectional view illustrating an example of an overall configuration of a light-emitting element according to a sixth embodiment along with diagrams, in each of which a main portion of the light-emitting element is enlarged and schematically illustrated.

FIG. 11 is a cross-sectional view illustrating an example of an overall configuration of a light-emitting element 60 according to the present embodiment along with diagrams, in each of which a main portion of the light-emitting element 60 is enlarged and schematically illustrated.

The light-emitting element 60 illustrated in FIG. 11 has a configuration in which a cathode electrode 5, an EIL 43 (first layer), an ETL 44, an EML 3, an HTL 23 (second layer), and an anode electrode 1 are layered in that order from the lower layer side.

In the fourth and fifth embodiments, the case in which the first layer is an electron transport layer is exemplified and explained. However, in order to adjust carrier balancing, it is sufficient for a first layer to be provided between the first electrode and an EML. Therefore, when the first electrode is a cathode electrode and a first layer is a layer having electron transport properties, the first layer is not necessarily required to be an ETL, and may be an EIL.

The light-emitting element 60 illustrated in FIG. 11 differs from the light-emitting element 50 according to the fifth embodiment only in a point that the EIL 43 and ETL 44 are provided instead of the ETL 42.

The EIL 43 is a layer for transporting electrons to the ETL 44, and the ETL 44 is a layer, similar to the ETL 42, for transporting electrons to the EML 3. The EIL 43 or ETL 44 may have a function of inhibiting the transport of positive holes.

The EIL 43 includes an electron transport material 43a as a carrier transport material (first carrier transport material) and also includes a first polymer 43b as a binder, as illustrated in FIG. 11. The same material as that of the electron transport material 42a may be used as the electron transport material 43a. As the first polymer 43b, the same material as that of the first polymer 42b may be used. Accordingly, a distance d6 between the adjacent electron transport materials 43a (the distance between nanoparticles) in the EIL 43 may be set similar to the distance d4 between the adjacent electron transport materials 42a in the ETL 42.

The ETL 44 differs from the ETL 42 in that the first polymer 42b is not included therein. That is, the ETL 44 includes an electron transport material 44a as a carrier transport material (third carrier transport material). The same material as that of the electron transport material 41a according to the second embodiment may be used as the electron transport material 44a.

The light-emitting element 60 according to the present embodiment is such that the EIL 43 includes the electron transport material 43a, and the first polymer 43b containing a polysiloxane bond in the main chain and having a functional group including a π-conjugated electron pair in a side chain of the first polymer 43b. Due to this, in the EIL 43, the electrons not only perform hopping conduction directly from the electron transport material 43a to another electron transport material 43a, but also perform stepwise hopping conduction in between via a functional group including a π-conjugated electron pair in the side chain of the first polymer 43b, as illustrated in FIG. 11. In other words, when the electrons perform hopping conduction from the electron transport material 43a to another electron transport material 43a, it is possible to perform hopping conduction once from the electron transport material 43a to the functional group, and then perform hopping conduction from the functional group to the above described another electron transport material 43a. This improves an electron mobility of the EIL 43.

Meanwhile, the light-emitting element 60 according to the present embodiment is such that the HTL 23 includes a hole transport material 23a, and a second polymer 23b containing a polysiloxane bond in the main chain and including a 1 to 10 carbon alkyl group in which no substitution is made or some hydrogen atoms are substituted in a side chain of the second polymer 23b. Due to this, as illustrated in FIG. 11, in the HTL 23, positive holes move by direct hopping conduction from the hole transport material 23a to another hole transport material 23a.

Thus, according to the present embodiment, by using different polymers for the first polymer 43b and the second polymer 23b, it is possible to adjust the frequency of carrier hopping conduction and control a carrier mobility of the EIL 43 and the HTL 23.

According to the present embodiment, as discussed above, by causing the frequency of the electron hopping conduction in the EIL 43 to be higher than the frequency of the hole hopping conduction in the HTL 23, it is possible to promote electron injection and suppress hole injection. Thus, as in the fourth embodiment, in the present embodiment, the amounts of the positive holes and electrons injected into the EML 3 may be aligned, so that carrier balancing between the positive holes and electrons may be improved. As a result, according to the present embodiment, the recombination probability between positive holes and electrons may be improved as compared to techniques in the related art, and luminous efficiency may be improved as compared to the techniques in the related art.

According to the present embodiment as well, since the first polymer 43b and the second polymer 23b each include PSQ as a main component, durability is improved and film formability is also improved, thereby making it possible to suppress generation of pinholes. Furthermore, also in the present embodiment, since the second polymer 23b includes PSQ as the main component, it is possible to suppress the extinction derived from hydroxy groups on the surfaces of the metal oxide nanoparticles when the metal oxide nanoparticles are used for the hole transport materials 23a. This makes it possible to provide the light-emitting element 60 having high external quantum efficiency.

The first polymer 43b and the second polymer 23b are chemically bonded to the metal oxide nanoparticles, for example, to form a thin polymeric coating film. Due to this, a drive voltage is not raised, so that a device with a low drive voltage may be fabricated.

In the present embodiment as well, the EIL 43 and HTL 23 may be easily formed by an application process. This makes it possible to suppress the manufacturing cost.

First Modified Example

In FIG. 11, a case in which the EIL 43 and the ETL 44 are provided in place of the ETL 42 in the light-emitting element 40 illustrated in FIG. 9 is exemplified and illustrated. However, the present embodiment is not limited to this example. The light-emitting element 60 according to the present embodiment may have a configuration in which the EIL 43 and ETL 44 are provided in place of the ETL 42 in the light-emitting element 50 illustrated in FIG. 10, for example. In this case, a light-emitting element exhibiting both the advantageous effects according to the present embodiment and the advantageous effects according to the fifth embodiment may be provided. Obviously, similar modifications to those of the fourth and fifth embodiments may also be carried out in the present embodiment.

Second Modified Example

As described above, at least one first layer may be provided between the first electrode and the EML, or a plurality of first layers may be provided therebetween. Accordingly, when the first electrode is a cathode electrode and the first layer is a layer having electron transport properties, the EIL and the ETL may each include an electron transport material, and a first polymer containing a polysiloxane bond in the main chain and having a functional group including a π-conjugated electron pair in a side chain of the first polymer.

As discussed above, at least one second layer may be provided between the second electrode and the EML, or a plurality of second layers may be provided therebetween. Likewise, when the second electrode is an anode electrode and the second layer is a layer having hole transport properties, an HIL and an HTL may each include a hole transport material, and a second polymer containing a polysiloxane bond in the main chain and having a 1 to 10 carbon alkyl group in which no substitution is made or some hydrogen atoms are substituted in a side chain of the second polymer. The EIL may be the second layer in place of the HTL illustrated in FIG. 9 or 11. That is, in FIG. 9 or FIG. 11, instead of the HTL 23, an EIL including the hole transport material and the second polymer, and the HTL including no second polymer may be provided in that order from the anode electrode 1 side.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A light-emitting element comprising:
   a first electrode;
   a second electrode;
   a light-emitting layer provided between the first electrode and the second electrode;
   a first layer having carrier transport properties and provided between the first electrode and the light-emitting layer, and
   a second layer having carrier transport properties and provided between the second electrode and the light-emitting layer,
   wherein the first layer includes
   a first carrier transport material, and
   a first polymer containing a polysiloxane bond in a main chain and containing a functional group including a π-conjugated electron pair in a side chain of the first polymer, and
   wherein the second layer includes
   a second carrier transport material, and
   a second polymer containing a polysiloxane bond in a main chain and containing a 1 to 10 carbon alkyl group in which no substitution is made or some hydrogen atoms are substituted in a side chain of the second polymer.

2. The light-emitting element according to claim 1,
   wherein the first polymer contains, as the functional group including the π-conjugated electron pair, at least one type of functional group selected from the group consisting of,
   an aryl group composed of any of a five-membered ring, a six-membered ring, and a seven-membered ring,
   a fused ring of the aryl group,
   a derivative of the aryl group,
   a derivative of the fused ring of the aryl group, a heteroaryl group composed of any of a five-membered ring, six-membered ring or seven-membered ring, and including one to three heteroatoms of at least one type selected from the group consisting of nitrogen, sulfur, oxygen, and boron, a fused ring of the heteroaryl group, a derivative of the heteroaryl group, and a derivative of the fused ring of the heteroaryl group.

3. The light-emitting element according to claim 1, wherein the alkyl group is an unsubstituted 1 to 3 carbon alkyl group.

4. The light-emitting element according to claim 1, wherein the first electrode is an anode, the second electrode is a cathode, the first layer is a hole transport layer, and the second layer is an electron transport layer.

5. The light-emitting element according to claim 4, wherein the first carrier transport material contains fine particles of at least one type of metal oxide selected from the group consisting of nickel oxide, titanium oxide, molybdenum oxide, magnesium oxide, and lanthanum nickel oxide, or contains mixed crystal-based fine particles of the selected metal oxide.

6. The light-emitting element according to claim 4, wherein the second carrier transport material contains fine particles of at least one type of metal oxide selected from the group consisting of zinc oxide, titanium oxide, indium oxide, tin oxide, or cerium oxide, or contains mixed crystal-based fine particles of the selected metal oxide.

7. The light-emitting element according to claim 1, wherein the first electrode is a cathode, the second electrode is an anode, the first layer is an electron transport layer, and the second layer is a hole transport layer.

8. The light-emitting element according to claim 1, wherein the second carrier transport material and the second polymer are chemically bonded to each other.

9. The light-emitting element according to claim 1, wherein the first carrier transport material and the first polymer are chemically bonded to each other.

\* \* \* \* \*